United States Patent
Wei et al.

(10) Patent No.: US 12,237,388 B2
(45) Date of Patent: Feb. 25, 2025

(54) TRANSISTOR ARRANGEMENTS WITH STACKED TRENCH CONTACTS AND GATE STRAPS

(71) Applicant: Intel Corporation, Santa Clara, CA (US)

(72) Inventors: Andy Chih-Hung Wei, Yamhill, OR (US); Changyok Park, Portland, OR (US); Guillaume Bouche, Portland, OR (US); Hyuk Ju Ryu, Portland, OR (US); Charles Henry Wallace, Portland, OR (US); Mohit K. Haran, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 17/123,828

(22) Filed: Dec. 16, 2020

(65) Prior Publication Data
US 2022/0190129 A1    Jun. 16, 2022

(51) Int. Cl.
*H01L 29/423*    (2006.01)
*H01L 21/768*    (2006.01)
(Continued)

(52) U.S. Cl.
CPC ...... *H01L 29/4236* (2013.01); *H01L 29/1033* (2013.01); *H01L 29/1095* (2013.01); *H01L 29/7855* (2013.01)

(58) Field of Classification Search
CPC ............. H01L 29/4236; H01L 29/1033; H01L 29/1095; H01L 29/7855; H01L 21/76831;
(Continued)

(56) References Cited

U.S. PATENT DOCUMENTS 9,466,570 B1   10/2016   Cheng et al.
9,508,825 B1   11/2016   Basker et al.
(Continued)

FOREIGN PATENT DOCUMENTS

KR    20120058325 A    6/2012
TW     201828473 A    8/2018

OTHER PUBLICATIONS

Extended European Search Report in European Patent Application 21195724.6 dated Feb. 18, 2022, 10 pages.
(Continued)

*Primary Examiner* — Yara B Green
*Assistant Examiner* — Akhee Sarker-Nag
(74) *Attorney, Agent, or Firm* — Akona IP PC

(57) ABSTRACT

Disclosed herein are transistor arrangements with trench contacts that have two parts—a first trench contact and a second trench contact—stacked over one another. Such transistor arrangements may be fabricated by forming a first trench contact over a source or drain contact of a transistor, recessing the first trench contact, forming the second trench contact over the first trench contact, and, finally, forming a gate contact that is electrically isolated from, while being self-aligned to, the second trench contact. Such a fabrication process may provide improvements in terms of increased edge placement error margin, cost-efficiency, and device performance, compared to conventional approaches to forming trench and gate contacts. The conductive material of the first trench contact may also be deposited over the gate electrodes of transistors, forming a gate strap, to advantageously reduce gate resistance.

20 Claims, 27 Drawing Sheets

(51) Int. Cl.
*H01L 25/065* (2023.01)
*H01L 27/088* (2006.01)
*H01L 29/10* (2006.01)
*H01L 29/78* (2006.01)

(58) Field of Classification Search
CPC ......... H01L 21/76897; H01L 21/76895; H01L 29/1037; H01L 29/4232; H01L 29/785; H01L 2029/7858; H01L 27/088; H01L 25/065
See application file for complete search history.

(56) References Cited

U.S. PATENT DOCUMENTS

| | | |
|---|---|---|
| 9,899,321 B1 | 2/2018 | Park et al. |
| 10,199,271 B1 | 2/2019 | Xie et al. |
| 10,236,215 B1 | 3/2019 | Xie et al. |
| 10,312,188 B1 | 6/2019 | Srivastava et al. |
| 10,388,745 B1 | 8/2019 | Sung |
| 10,490,458 B2 | 11/2019 | Perng et al. |
| 10,573,724 B2 | 2/2020 | Cheng |
| 10,818,768 B1 | 10/2020 | Cheng et al. |
| 11,004,750 B2 * | 5/2021 | Xie ................... H01L 21/76831 |
| 2009/0108379 A1 | 4/2009 | Oosuka et al. |
| 2012/0261828 A1 | 10/2012 | Bruce et al. |
| 2013/0033581 A1 | 2/2013 | Woo et al. |
| 2014/0011345 A1 | 1/2014 | Chua et al. |
| 2015/0235948 A1 | 8/2015 | Song et al. |
| 2015/0311082 A1 | 10/2015 | Bouche et al. |
| 2016/0322707 A1 | 11/2016 | Nair et al. |
| 2016/0379925 A1 * | 12/2016 | Ok ................... H01L 21/76802 438/666 |
| 2017/0243947 A1 * | 8/2017 | Adusumilli ............. H01L 29/45 |
| 2017/0288031 A1 | 10/2017 | Ho et al. |
| 2018/0174904 A1 | 6/2018 | Hsieh et al. |
| 2019/0067187 A1 | 2/2019 | Yang et al. |
| 2020/0144118 A1 | 5/2020 | Cheng et al. |
| 2020/0212189 A1 | 7/2020 | Tan |
| 2020/0243385 A1 * | 7/2020 | Huang ............... H01L 21/76877 |
| 2021/0225706 A1 * | 7/2021 | Huang ............... H01L 21/76834 |
| 2021/0391432 A1 * | 12/2021 | Yoo ................... H01L 21/76895 |
| 2021/0408247 A1 | 12/2021 | Yu et al. |
| 2022/0190128 A1 | 6/2022 | Wallace et al. |

OTHER PUBLICATIONS

Extended European Search Report in European Patent Application 22151285.8 dated Jun. 30, 2022, 9 pages.

* cited by examiner

TRANSISTOR ARRANGEMENTS WITH STACKED TRENCH CONTACTS AND GATE STRAPS

TECHNICAL FIELD

This disclosure relates generally to the field of semiconductor devices, and more specifically, to transistor arrangements.

BACKGROUND

A field-effect transistor (FET), e.g., a metal-oxide-semiconductor (MOS) FET (MOSFET), is a three-terminal device that includes source, drain, and gate terminals and uses electric field to control current flowing through the device. A FET typically includes a semiconductor channel material, a source and a drain regions provided in the channel material, and a gate stack that includes at least a gate electrode material and may also include a gate dielectric material, the gate stack provided over a portion of the channel material between the source and the drain regions. Because gate electrode materials often include metals, gates of transistors are commonly referred to as "metal gates."

Recently, FETs with non-planar architectures, such as FinFETs (also sometimes referred to as "wrap-around gate transistors" or "tri-gate transistors") and nanoribbon/nanowire transistors (also sometimes referred to as "all-around gate transistors"), have been extensively explored as alternatives to transistors with planar architectures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A-5K are cross-sectional side views illustrating different example stages in the manufacture of a transistor arrangement with one or more stacked trench contacts using the method of FIGS. 4A-4B, according to some embodiments of the present disclosure.

DETAILED DESCRIPTION

Overview

Figure 1:
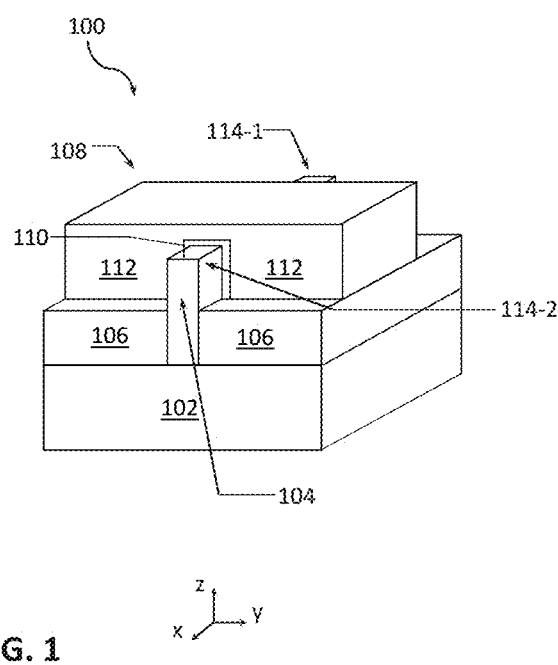
FIG. 1 is a perspective view of an example FinFET, according to some embodiments of the disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating transistor arrangements with one or more stacked trench contacts and/or one or more gate straps, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of transistors being implemented as FinFETs, embodiments of the present disclosure are equally applicable to transistor arrangements employing transistors of other architectures, such as nanoribbon or nanowire transistors, as well as to planar transistors.

As described above, recently, FETs with non-planar architectures, such as FinFETs and nanoribbon/nanowire transistors, have been extensively explored as alternatives to transistors with planar architectures.

In a FinFET, a semiconductor structure shaped as a fin extends away from a base (e.g., from a semiconductor substrate), and a gate stack may wrap around the upper portion of the fin (i.e., the portion farthest away from the base), potentially forming a gate on 3 sides of the fin. The portion of the fin around which the gate stack wraps around is referred to as a "channel" or a "channel portion" of a FinFET. A semiconductor material of the channel portion is commonly referred to as a "channel material" of the transistor. A source region and a drain region are provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel portion" of a nanoribbon transistor is the portion of the nanoribbon around which the gate stack wraps around. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (i.e., a cross-section in a plane perpendicular to the longitudinal axis of the structure), while the term "nanowire" has been used to describe a similar structure but with a substantially circular transverse cross-section.

Taking FinFETs as an example, oftentimes, fabrication of an IC device having an array of FinFETs involves, first, providing a plurality of fins (typically parallel to one another), and then providing metal gate lines that cross over multiple fins (the metal gate lines often, but not always, being substantially perpendicular to the lengths, or longitudinal axes, of the fins, the metal gate lines provided in a plane substantially parallel to the plane of the support structure on which the fins are formed). A metal gate line crossing a first fin of the plurality of fins may form a gate of a transistor in the first fin, while the metal gate line crossing an adjacent second fin may form a gate of a transistor in the second fin. Since the metal gate line crosses over both the first and the second fins, the metal gate line is electrically continuous over the first and second fins, thereby providing an electrical coupling between the gate of the transistor in the first fin and the gate of the transistor in the second fin. In a later part of a fabrication process, it may be desirable to disrupt this continuity, e.g., if the design is such that it requires that the gate of the transistor in the first fin is decoupled from the gate of the transistor in the second fin. Also in a later part of a fabrication process, trench contacts are formed, where, as used herein, the term "trench contact" refers to a structure that is supposed to provide electrical connectivity to (i.e., is a contact) to source or drain (S/D) contacts of a transistor. In addition, gate contacts are formed, where the term "gate contact" refers to a structure that is supposed to provide electrical connectivity to (i.e., is a contact) to a gate (i.e., to a gate metal line) of a transistor.

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device becomes increasingly significant and such optimization is far from trivial.

One challenge that arises with the ever-decreasing dimensions of ICs is that the overlay between the electrically conductive structures of trench contacts and metal gates, as well as the overlay between the electrically conductive structures of trench contacts and adjacent gate contacts generally need to be controlled to high tolerances. To that end, the term "edge placement error margin" refers to a measure of how much misalignment between these electrically conductive structures may be tolerated. On one hand, etch selectivity between different materials may be used to ensure that proper contacts between different electrically conductive structures are made, where two materials may be described as "sufficiently etch-selective" if etchants used to etch one material do not substantially etch the other material, and vice versa. However, as the transistor dimensions become even smaller over time, etch selectivity may not be enough to allow adequate over-etch to ensure no open contacts or shorts at small dimensions. On the other hand, complex fabrication processes may be implemented where multiple mask and polish processes are used, and where an intricate series of fabrication steps involving multiple liners and helmets may allow addressing the edge placement error margin issues, but such fabrication processes may not always be sufficiently cost-efficient. Another challenge with the ever-decreasing dimensions of ICs is that gate resistance may be relatively large.

Described herein are transistor arrangements with trench contacts that have two parts—a first trench contact and a second trench contact—stacked over one another. Such transistor arrangements may be fabricated by forming a first trench contact over a S/D contact of a transistor, recessing the first trench contact, forming the second trench contact over the first trench contact, and, finally, forming a gate contact that is electrically isolated from, while being self-aligned to, the second trench contact. Such a fabrication process may provide improvements in terms of increased edge placement error margin, cost-efficiency, and device performance, compared to conventional approaches to forming trench and gate contacts.

In some optional implementations, the electrically conductive material of the first trench contact may also be deposited over the gate electrodes of transistors to advantageously reduce gate resistance. A structure of the electrically conductive material of the first trench contact provided over a gate electrode of a transistor is referred to herein as a "gate strap." The electrically conductive material of such a gate strap would typically have a lower resistance than that of a gate electrode material of a transistor, thereby reducing the overall gate resistance to a resistance of two circuit components with different resistances connected in series. In other implementations, gate straps may be implemented without implementing the stacked trench contacts in the manner described herein (e.g., the gate straps as described herein may be combined with any conventional ways to provide trench contacts).

While descriptions provided herein refer to FinFETs, these descriptions are equally applicable to embodiments any other non-planar FETs besides FinFETs, e.g., to nanoribbon transistors, nanowire transistors, or transistors such as nanoribbon/nanowire transistors but having transverse cross-sections of any geometry (e.g., oval, or a polygon with rounded corners).

IC structures as described herein, in particular transistor arrangements with one or more stacked trench contacts and/or one or more gate straps as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of stacked trench contacts, a certain number of gate contacts, a certain number of metal gate lines, etc.), this is simply for ease of illustration, and more, or less, than that number may be included in a transistor arrangement with one or more stacked trench contacts and/or one or more gate straps as described herein. Still further, various views shown in some of the drawings are intended to show relative arrangements of various elements therein. In other embodiments, various transistor arrangements with one or more stacked trench contacts and/or one or more gate straps as described herein, or portions thereof, may include other elements or components that are not illustrated (e.g., transistor portions, various components that may be in electrical contact with any of the metal lines, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of transistor arrangements with one or more stacked trench contacts and/or one or more gate straps as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both trench contacts (also sometimes referred to as "lines") and vias. In general, a term "trench contact" may be used to describe an electrically conductive element isolated by a dielectric material typically comprising an interlayer low-k dielectric that is provided within the plane of an IC chip. Such trench contacts are typically arranged in several levels, or several layers, of metallization stacks. On the other hand, the term "via" may be used to describe an electrically conductive element that interconnects two or more trench contacts of different levels. To that end, a via may be provided substantially perpendicularly to the plane of an IC chip and may interconnect two trench contacts in adjacent levels or two trench contacts in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example FinFET

FIG. 1 is a perspective view of an example FinFET 100, according to some embodiments of the disclosure. The FinFET 100 illustrates one example of transistors that may be implemented in various transistor arrangements described herein, e.g., in the transistor arrangements shown in FIG. 3 and FIGS. 5-8. The FinFET 100 shown in FIG. 1 is intended to show relative arrangement(s) of some of the components therein. In various embodiments, the FinFET 100, or portions thereof, may include other components that are not illustrated (e.g., any further materials, such as e.g. spacer materials, surrounding the gate stack of the FinFET 100, electrical contacts to the S/D regions of the FinFET 100, etc.).

As shown in FIG. 1, the FinFET 100 may be provided over a base 102, where the term "base" may refer to any suitable support structure on which a transistor may be built, e.g., a substrate, a die, a wafer, or a chip. As also shown in FIG. 1, the FinFET 100 may include a fin 104, extending away from the base 102. A portion of the fin 104 that is closest to the base 102 may be enclosed by an insulator material 106, commonly referred to as a "shallow trench isolation" (STI). The portion of the fin 104 enclosed on its' sides by the STI 106 is typically referred to as a "subfin portion" or simply a "subfin." As further shown in FIG. 1, a gate stack 108 that includes at least a layer of a gate electrode material 112 and, optionally, a layer of a gate dielectric 110, may be provided over the top and sides of the remaining upper portion of the fin 104 (e.g., the portion above and not enclosed by the STI 106), thus wrapping around the upper-most portion of the fin 104. The portion of the fin 104 over which the gate stack 108 wraps around may be referred to as a "channel portion" of the fin 104 because this is where, during operation of the FinFET 100, a conductive channel may form. The channel portion of the fin 104 is a part of an active region of the fin 104. A first S/D region 114-1 and a second S/D region 114-2 (also commonly referred to as "diffusion regions") are provided on the opposite sides of the gate stack 108, forming source and drain terminals of the FinFET 100.

In general, implementations of the present disclosure may be formed or carried out on a support structure such as a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which transistor arrangements with one or more stacked trench contacts and/or one or more gate straps as described herein may be built falls within the spirit and scope of the present disclosure. In various embodiments, the base 102 may include any such substrate material that provides a suitable surface for forming the FinFET 100.

As shown in FIG. 1, the fin 104 may extend away from the base 102 and may be substantially perpendicular to the base 102. The fin 104 may include one or more semiconductor materials, e.g. a stack of semiconductor materials, so that the upper-most portion of the fin (namely, the portion of the fin 104 enclosed by the gate stack 108) may serve as the channel region of the FinFET 100. Therefore, as used herein, the term "channel material" of a transistor may refer to such upper-most portion of the fin 104, or, more generally, to any portion of one or more semiconductor materials in which a conductive channel between source and drain regions may be formed during operation of a transistor.

As shown in FIG. 1, the STI material 106 may enclose the sides of the fin 104. A portion of the fin 104 enclosed by the STI 106 forms a subfin. In various embodiments, the STI material 106 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 106 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 104, the gate stack 108 may wrap around the fin 104 as shown in FIG. 1. In particular, the gate dielectric 110 may wrap around the upper-most portion of the fin 104, and the gate electrode 112 may wrap around the gate dielectric 110. The interface between the channel portion of the fin 104 and the subfin portion of the fin 104 is located proximate to where the gate electrode 112 ends.

The gate electrode 112 may include one or more gate electrode materials, where the choice of the gate electrode materials may depend on whether the FinFET 100 is a P-type metal-oxide-semiconductor (PMOS) transistor or an N-type metal-oxide-semiconductor (NMOS) transistor. For a PMOS transistor, gate electrode materials that may be used in different portions of the gate electrode 112 may include, but are not limited to, ruthenium, palladium, platinum, cobalt, nickel, and conductive metal oxides (e.g., ruthenium oxide). For an NMOS transistor, gate electrode materials that may be used in different portions of the gate electrode 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 112 may include a stack of a plurality of gate electrode materials, where zero or more materials of the stack are workfunction (WF) materials and at least one material of the stack is a fill metal layer. Further materials/layers may be included next to the gate electrode 112 for other purposes, such as to act as a diffusion barrier layer or/and an adhesion layer.

If used, the gate dielectric 110 may include a stack of one or more gate dielectric materials. In some embodiments, the gate dielectric 110 may include one or more high-k dielectric materials. In various embodiments, the high-k dielectric materials of the gate dielectric 110 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the FinFET 100 to improve the quality of the gate dielectric 110.

Figure 5A:
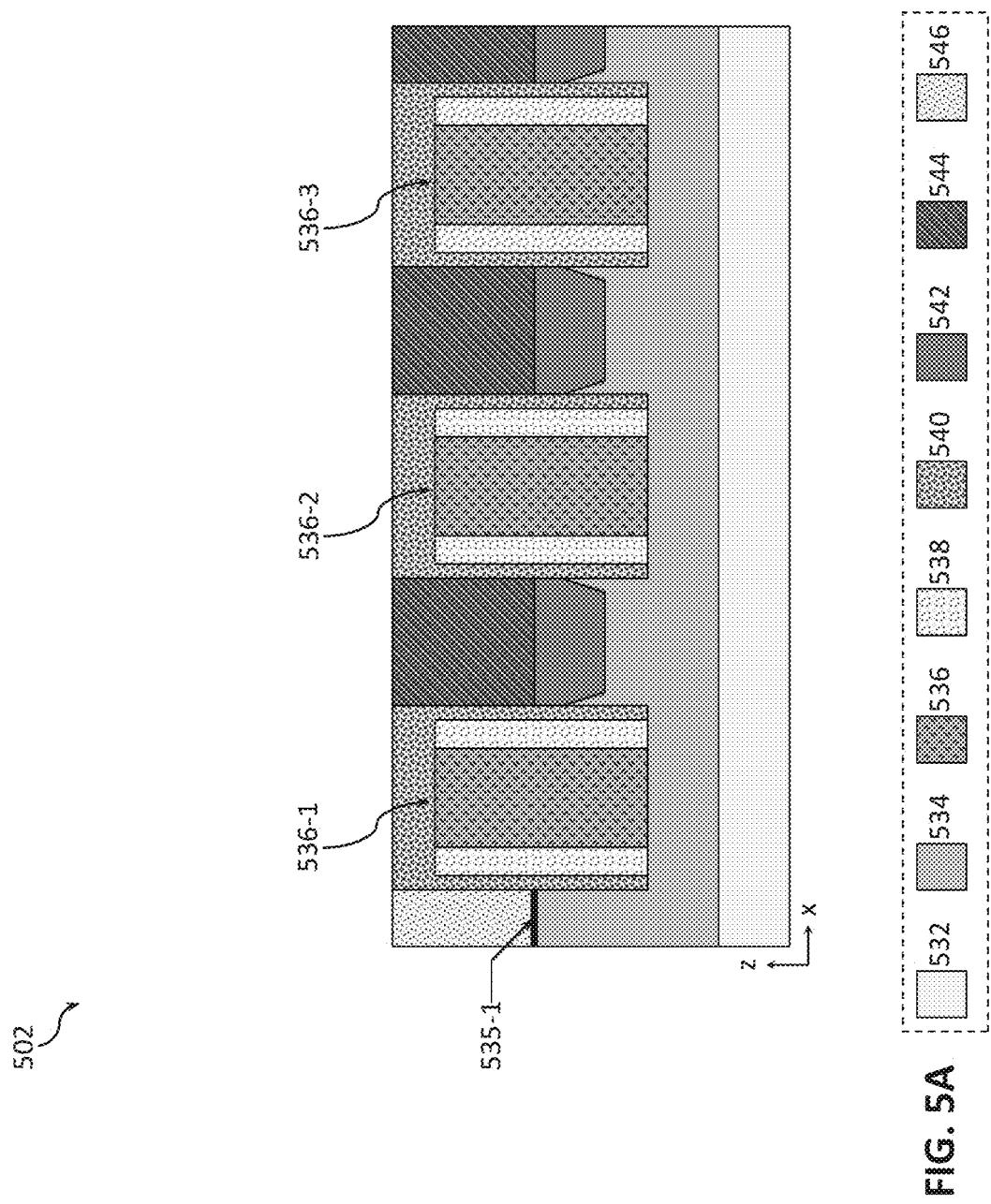
Figure 5B:
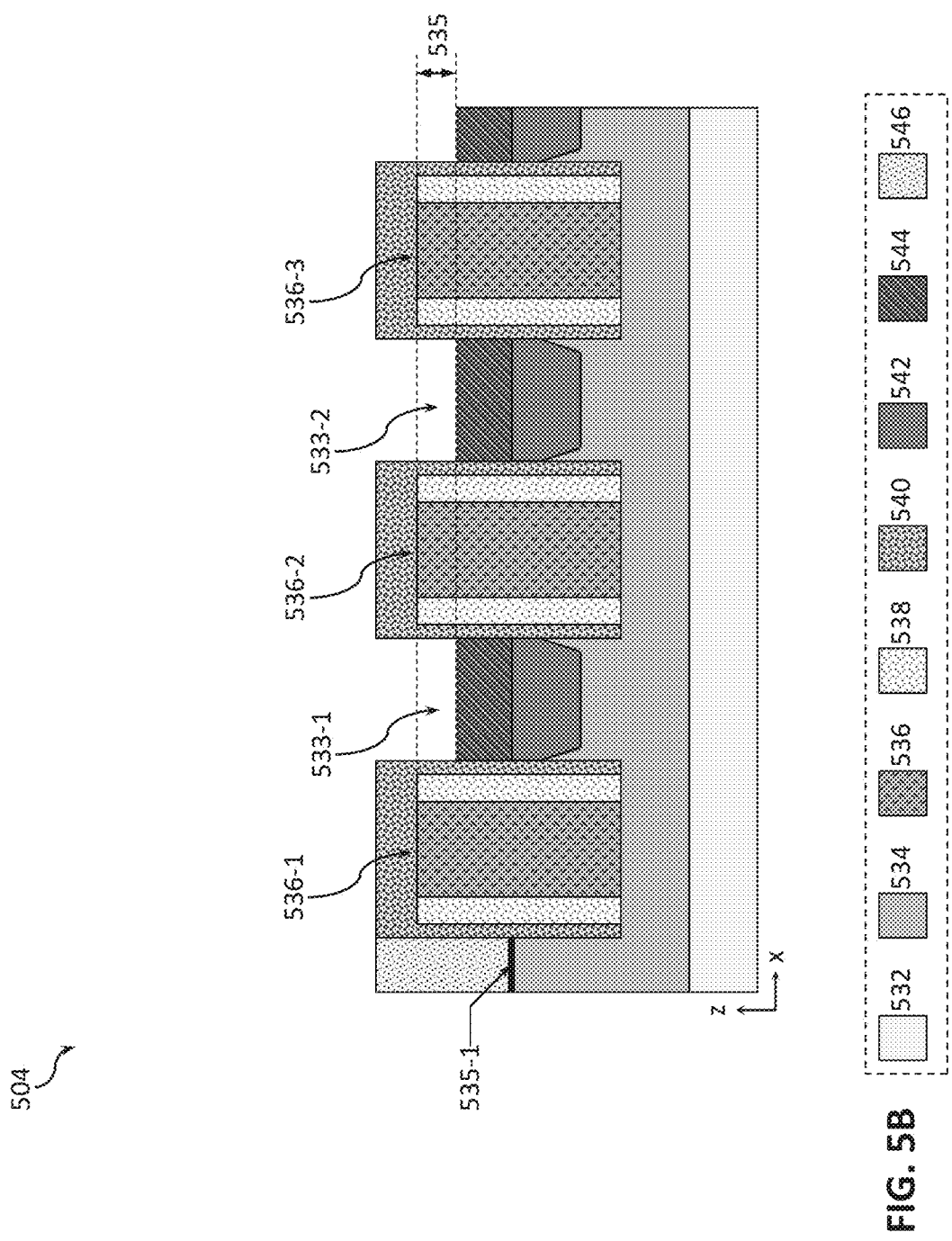
Figure 5C:
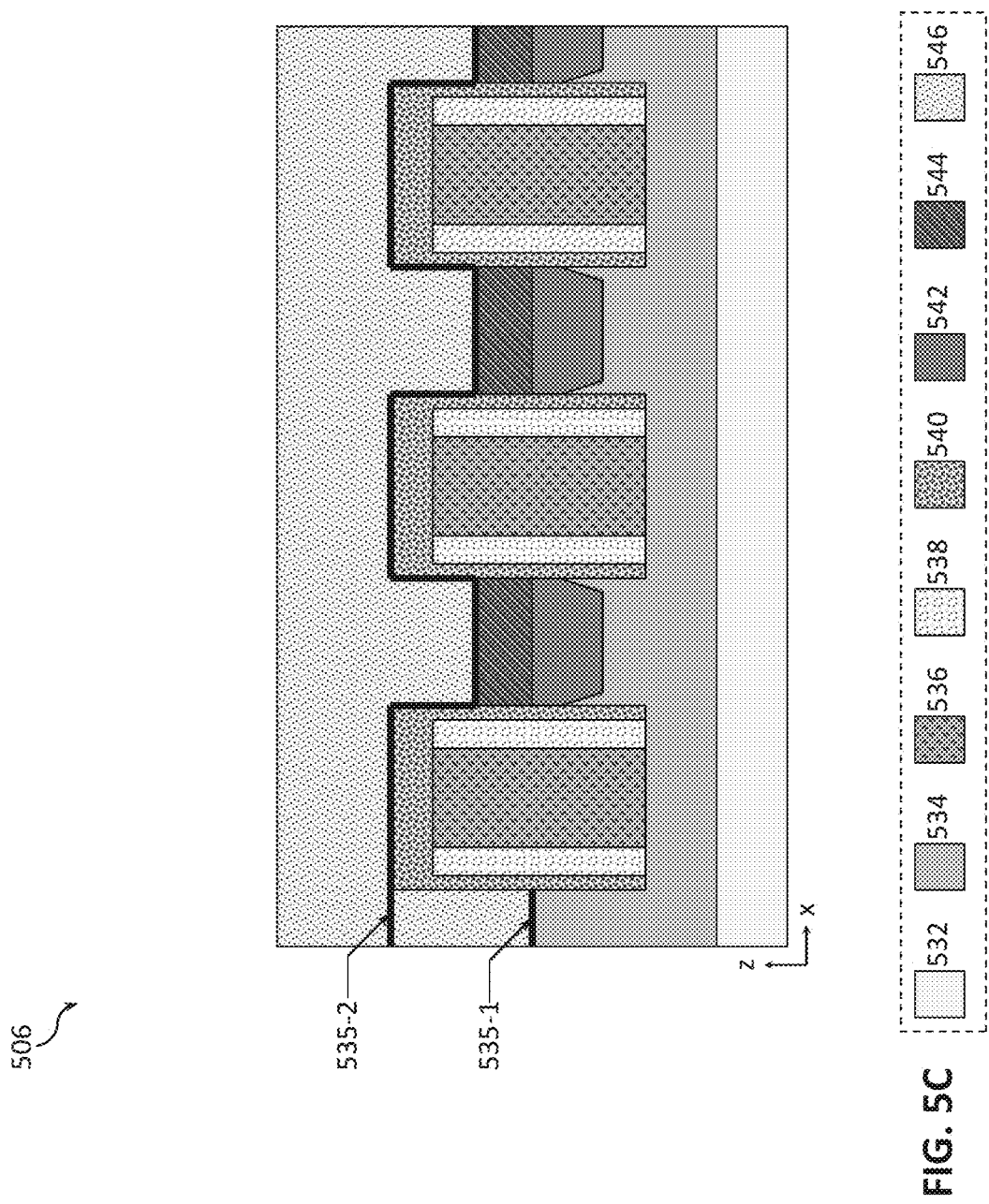

In some embodiments, the gate stack 108 may be surrounded by a dielectric spacer, not specifically shown in FIG. 1 but shown, e.g., in FIG. 5A as a gate spacer 538. The dielectric spacer may be configured to provide separation between the gate stacks 108 of different FinFETs 100 which may be provided along a single fin (e.g., different FinFETs provided along the fin 104, although FIG. 1 only illustrates one of such FinFETs), as well as between the gate stack 108 and the source/drain contacts disposed on each side of the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a dielectric spacer is used, then the lower portions of the fin 104, e.g., the subfin portion of the fin 104, may be surrounded by the STI material 106 which may, e.g., include any of the high-k dielectric materials described herein.

In some embodiments, the fin 104 may be composed of semiconductor material systems including, for example, N-type or P-type materials systems. In some embodiments, the fin 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 104 may include a combination of semiconductor materials where one semiconductor material is used for the channel portion and another material, sometimes referred to as a "blocking material," is used for at least a portion of the subfin portion of the fin 104. In some embodiments, the subfin and the channel portions of the fin 104 are each formed of monocrystalline semiconductors, such as e.g. Si or Ge. In a first embodiment, the subfin and the channel portion of the fin 104 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For some example N-type transistor embodiments (i.e., for the embodiments where the FinFET 100 is an NMOS), the channel portion of the fin 104 may advantageously include a III-V material having a high electron mobility, such as, but not limited to InGaAs, InP, InSb, and InAs. For some such embodiments, the channel portion of the fin 104 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 104 may be an intrinsic III-V material, i.e., a III-V semiconductor material not intentionally doped with any electrically active impurity. In alternate embodiments, a nominal impurity dopant level may be present within the channel portion of the fin 104, for example to further fine-tune a threshold voltage Vt, or to provide HALO pocket implants, etc. Even for impurity-doped embodiments however, impurity dopant level within the channel portion of the fin 104 may be relatively low, for example below $10^{15}$ dopant atoms per cubic centimeter ($cm^{-3}$), and advantageously below $10^{13}$ $cm^{-3}$. The subfin portion of the fin 104 may be a III-V material having a band offset (e.g., conduction band offset for N-type devices) from the channel portion. Example materials include, but are not limited to, GaAs, GaSb, GaAsSb, GaP, InAlAs, GaAsSb, AlAs, AlP, AlSb, and AlGaAs. In some N-type transistor embodiments of the FinFET 100 where the channel portion of the fin 104 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 104 each include group IV semiconductors (e.g., Si, Ge, SiGe). The subfin of the fin 104 may be a first elemental semiconductor (e.g., Si or Ge) or a first SiGe alloy (e.g., having a wide bandgap).

For some example P-type transistor embodiments (i.e., for the embodiments where the FinFET 100 is a PMOS), the channel portion of the fin 104 may advantageously be a group IV material having a high hole mobility, such as, but not limited to Ge or a Ge-rich SiGe alloy. For some example embodiments, the channel portion of the fin 104 may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the fin 104, for example to further set a threshold voltage Vt, or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$. The subfin of the fin 104 may be a group IV material having a band offset (e.g., valance band offset for P-type devices) from the channel portion. Example materials include, but are not limited to, Si or Si-rich SiGe. In some P-type transistor embodiments, the subfin of the fin 104 is Si and at least a portion of the subfin may also be doped with impurities (e.g., N-type) to a higher impurity level than the channel portion.

Turning to the first S/D region 114-1 and the second S/D region 114-2 on respective different sides of the gate stack 108, in some embodiments, the first S/D region 114-1 may be a source region and the second S/D region 114-2 may be a drain region. In other embodiments this designation of source and drain may be interchanged, i.e., the first S/D region 114-1 may be a drain region and the second S/D region 114-2 may be a source region. Although not specifically shown in FIG. 1, the FinFET 100 may further include S/D electrodes (also commonly referred to as "S/D contacts"), formed of one or more electrically conductive materials, for providing electrical connectivity to the S/D regions 114, respectively. In some embodiments, the S/D regions 114 of the FinFET 100 may be regions of doped semiconductors, e.g., regions of doped channel material of the fin 104, so as to supply charge carriers for the transistor channel. In some embodiments, the S/D regions 114 may be highly doped, e.g. with dopant concentrations of about $1 \cdot 10^{21}$ cm$^{-3}$, in order to advantageously form Ohmic contacts with the respective S/D electrodes, although these regions may also have lower dopant concentrations and may form Schottky contacts in some implementations. Irrespective of the exact doping levels, the S/D regions 114 of the FinFET 100 are the regions having dopant concentration higher than in other regions, e.g., higher than a dopant concentration in a region of the semiconductor channel material between the first S/D region 114-1 and the second S/D region 114-2, and, therefore, may be referred to as "highly doped" (HD) regions.

In some embodiments, the S/D regions 114 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the fin 104 to form the S/D regions 114. An annealing process that activates the dopants and causes them to diffuse further into the fin 104 may follow the ion implantation process. In the latter process, the one or more semiconductor materials of the fin 104 may first be etched to form recesses at the locations for the future source and drain regions. An epitaxial deposition process may then be carried out to fill the recesses with material (which may include a combination of different materials) that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. Although not specifically shown in the perspective illustration of FIG. 1, in further embodiments, one or more layers of metal and/or metal alloys may be used to form the source and drain contacts (i.e., electrical contacts to each of the S/D regions 114).

The FinFET 100 may have a gate length, GL, (i.e. a distance between the first S/D region 114-1 and the second S/D region 114-2), a dimension measured along the fin 104 in the direction of the x-axis of the example reference coordinate system x-y-z shown in FIG. 1, which may, in some embodiments, be between about 5 and 40 nanometers, including all values and ranges therein (e.g. between about 10 and 35 nanometers, or between about 15 and 25 nanometers). The fin 104 may have a thickness, a dimension measured in the direction of the y-axis of the reference coordinate system x-y-z shown in FIG. 1, that may, in some embodiments, be between about 4 and 15 nanometers, including all values and ranges therein (e.g. between about 5 and 10 nanometers, or between about 7 and 12 nanometers). The fin 104 may have a height, a dimension measured in the direction of the z-axis of the reference coordinate system x-y-z shown in FIG. 1, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 104 illustrated in FIG. 1 is shown as having a rectangular cross-section in a z-y plane of the reference coordinate system shown in FIG. 1, the fin 104 may instead have a cross-section that is rounded or sloped at the "top" of the fin 104, and the gate stack 108 (including the different portions of the gate dielectric 110) may conform to this rounded or sloped fin 104. In use, the FinFET 100 may form conducting channels on three "sides" of the channel portion of the fin 104, potentially improving performance relative to single-gate transistors (which may form conducting channels on one "side" of a channel material or substrate) and double-gate transistors (which may form conducting channels on two "sides" of a channel material or substrate).

While FIG. 1 illustrates a single FinFET 100, in some embodiments, a plurality of FinFETs may be arranged next to one another (with some spacing in between) along the fin 104.

Example IC Structures with Stacked Trench Contacts and Gate Straps

Figure 2:
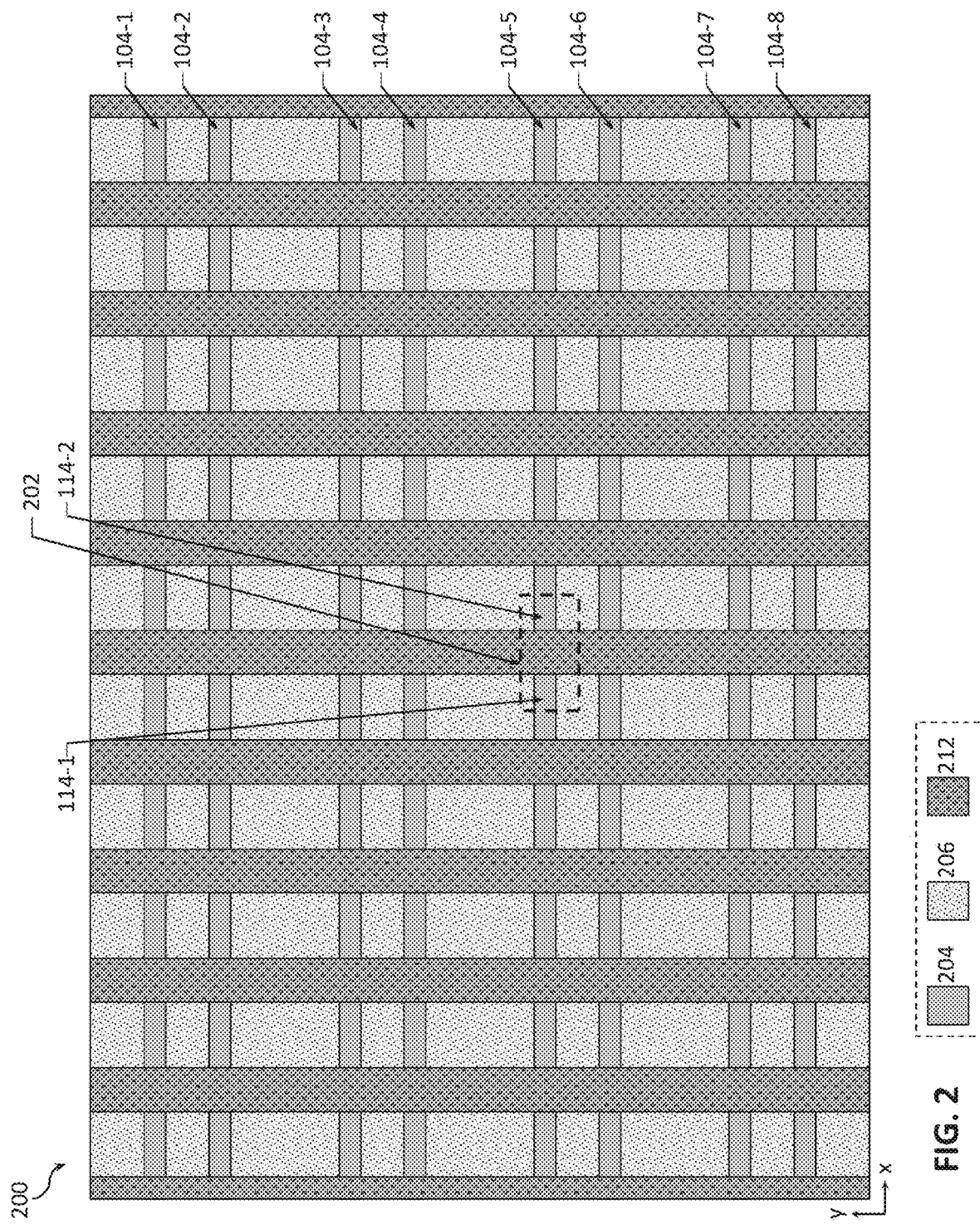
FIG. 2 is a top-down view of an example integrated circuit (IC) structure in which a transistor arrangement with one or more stacked trench contacts and/or one or more gate straps according to various embodiments of the disclosure may be implemented.
Figure 3:
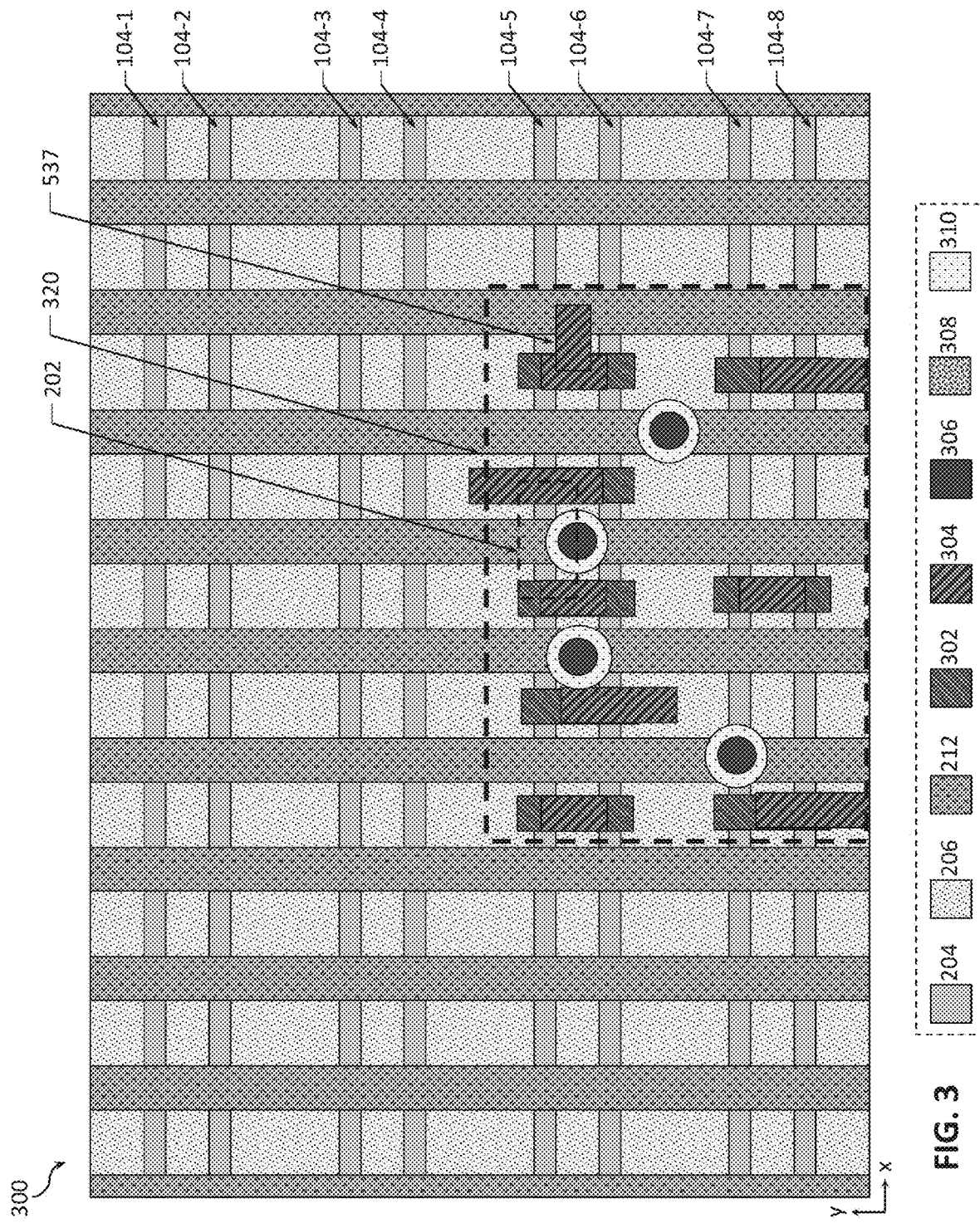
FIG. 3 is a top-down view of an IC structure that is similar to the IC structure of FIG. 2, further illustrating an example transistor arrangement with stacked trench contacts, according to some embodiments of the disclosure.

FIGS. 2 and 3 provide top-down views (i.e., the views of the x-y plane of the example reference coordinate system shown in FIG. 1) of an example IC structure in which transistor arrangements with one or more stacked trench contacts and/or one or more gate straps according to various embodiments of the disclosure may be implemented. In particular, FIG. 2 illustrates an IC structure 200 without any stacked trench contacts, while FIG. 3 illustrates an IC structure 300 with stacked trench contacts, according to some embodiments of the disclosure. The transistor arrangements shown in FIGS. 2 and 3 are intended to show relative arrangement(s) of some of the components therein and in various embodiments, the IC structures shown in FIGS. 2 and 3, or portions thereof, may include other components that are not illustrated (e.g., any further materials, such as spacer materials, STI, S/D regions or electrical contacts thereto, etc.). Same holds for subsequent drawings of the present disclosure.

A legend provided within a dashed box at the bottom of FIGS. 2 and 3 illustrates colors/patterns used to indicate some portions or materials of some of the elements shown in FIGS. 2 and 3, so that these drawings are not cluttered by too many reference numerals (the same holds for subsequent drawings of the present disclosure that include a legend at the bottom of the drawings). For example, FIGS. 2 and 3 use different colors/patterns to identify a channel material 204 (e.g., the channel material of the fins 104), a dielectric material 206, and a gate electrode material 212 of metal gate lines. In addition, FIG. 3 further uses different colors/patterns to identify a first trench contact material (referred to in the following as "TCN1 material" 302), a second trench contact material (referred to in the following as "TCN2 material") 304, a gate contact via material (referred to in the following as "VCG material") 306, a gate cap 308, and a dielectric liner material 310.

The IC structures shown in FIGS. 2 and 3, and in some of the subsequent drawings, are examples of how a plurality of the FinFETs 100 may be arranged in an IC device. Therefore, the IC structures shown in FIGS. 2-3 and in some of the subsequent drawings illustrate some elements labeled with the same reference numerals as those used in FIG. 1 to indicate similar or analogous elements in these drawings, so that, in the interests of brevity, descriptions of a given element provided with reference to one drawing does not have to be repeated again for other drawings. For example, FIGS. 2 and 3 illustrate the fin 104 (in particular, a plurality of such fins), and example S/D regions 114 for one example FinFET of the IC structures of FIGS. 2 and 3. The same holds for subsequent drawings of the present disclosure—elements with reference numerals used in one drawing and shown again in another drawing refer to similar or analogous elements so that their descriptions do not have to be repeated for each drawing.

As shown in FIG. 2, the IC structure 200 may include a channel material 204 shaped into a plurality of fins 104, which, in some embodiments, may extend substantially parallel to one another. Different instances of the fins 104 are shown in FIG. 2 with a dash and a different reference numeral after the reference numeral for the fin, 104 (the same notation is used for other elements in other drawings). The IC structure 200 illustrates an example of 8 fins 104, labeled as fins 104-1 through 104-8, but, in other embodiments, any other number of two or more fins 104 may be implemented in the IC structure 200.

Once the fins 104 are fabricated, metal gate lines 212 may be provided over the fins 104, crossing multiple fins 104. In some embodiments, the metal gate lines 212 may extend substantially perpendicular to the length of the fins 104. For example, if the fins 104 extend in the direction of the x-axis of the example coordinate system used in the present drawings, as shown in FIG. 2 (i.e., if each of the fins 104 may have a long axis substantially parallel to the support structure over which they are provided (e.g., the base 102) and different fins 104 may extend substantially parallel to one another), then the metal gate lines 212 may extend in the direction of the y-axis, as is shown in FIG. 2. In some embodiments, the metal gate lines 212 may be shaped as ridges, substantially perpendicular to the length of the fins 104 and enclosing different portions of the fins 104. At least portions of the metal gate lines 212 provided over the fins 104, i.e., where gates of FinFETs may be formed, as described with reference to FIG. 1, may include the gate electrode material 112, thus forming gate stacks 108, described above. In some embodiments, all of the metal gate lines 212 (i.e., also between the fins 104) are formed of one or more of the gate electrode material 112. In some embodiments, the gate electrode material 112 used in one portion of a given metal gate line 212 may have a material composition that is different from the material composition of the gate electrode material 112 used in another portion of that particular metal gate line 212. For example, the material composition of a portion of a given metal gate line 212 crossing the fins 104 in which NMOS transistors are to be formed may be different from the material composition of a portion of that metal gate line 212 crossing the fins 104 in which PMOS transistors are to be formed. For example, the fins 104-1 and 104-2 may be fins in which NMOS transistors can be formed, while the fins 104-3 and 104-4 may be fins in which PMOS transistors can be formed.

A dashed contour shown in FIG. 2 illustrates an example of a FinFET 202 formed in one of the fins 104, namely, in the fin 104-5. The FinFET 202 may be an example of the FinFET 100, described above. FIG. 2 illustrates the S/D regions 114-1 and 114-2 for the FinFET 202, and a portion of the metal gate line 212 crossing the fin 104-5 forms the gate stack 108 of the FinFET 202. A plurality of other such FinFETs are also shown in FIG. 2, although they are not specifically labeled with reference numerals in order to not clutter the drawings.

In some embodiments, a plurality of FinFETs 202 may be arranged to form a cell unit (or, simply, a "cell") with a particular logic function/functionality, and such cells may then be provided multiple times in an array form. Of course, in other embodiments of the IC structure 200, the FinFETs 202 may be arranged in ways that do not include repeating cell units.

FIG. 2 further illustrates that portions of the IC structure 200 surrounding the upper portions of the fins 104 may be enclosed by a dielectric material 206, which may include one or more of the dielectric spacer materials, described above. Although the top-down view of FIG. 2 illustrates the tops of the fins 104 in the portions where the metal gate lines 212 are not crossing the fins, in some embodiments, the dielectric material 206 may cover the tops of the fins 104 in those portions (in which case the fins 104 would not be visible in the top-down view of the IC structure 200).

FIG. 3 is a top-down view of an IC structure 300 that is similar to the IC structure 200 of FIG. 2, further illustrating an example transistor arrangement with stacked trench contacts, according to some embodiments of the disclosure. A transistor arrangement 320, shown in FIG. 3 to be included within a dashed box, is a portion of the IC structure 300 in which one or more stacked trench contacts and/or one or more gate straps may be implemented, according to some embodiments of the disclosure. In particular, the top-down view of the transistor arrangement 320 as shown in FIG. 3 illustrates the TCN1 material 302, the TCN2 material 304, the VCG material 306, the dielectric liner material 310, and the TCN2 material 304 in an opening 537 to form a GCN contact, which will be described in greater detail below with reference to the manufacturing method and resulting devices. A gate cap provided over portions of the metal lines as described below is not specifically shown in FIG. 3. One example of the FinFET 202 similar to that shown in FIG. 2 is labeled in the transistor arrangement 320, although the transistor arrangement 320 includes several FinFETs such as the FinFET 202. Although not specifically shown in FIG. 3 outside of the dashed box illustrating the transistor arrangement 320 in order to not clutter the drawing, the transistor arrangement 320 as described herein may also be included in other portions of the IC structure 300.

Example Fabrication Method

Figure 4A:
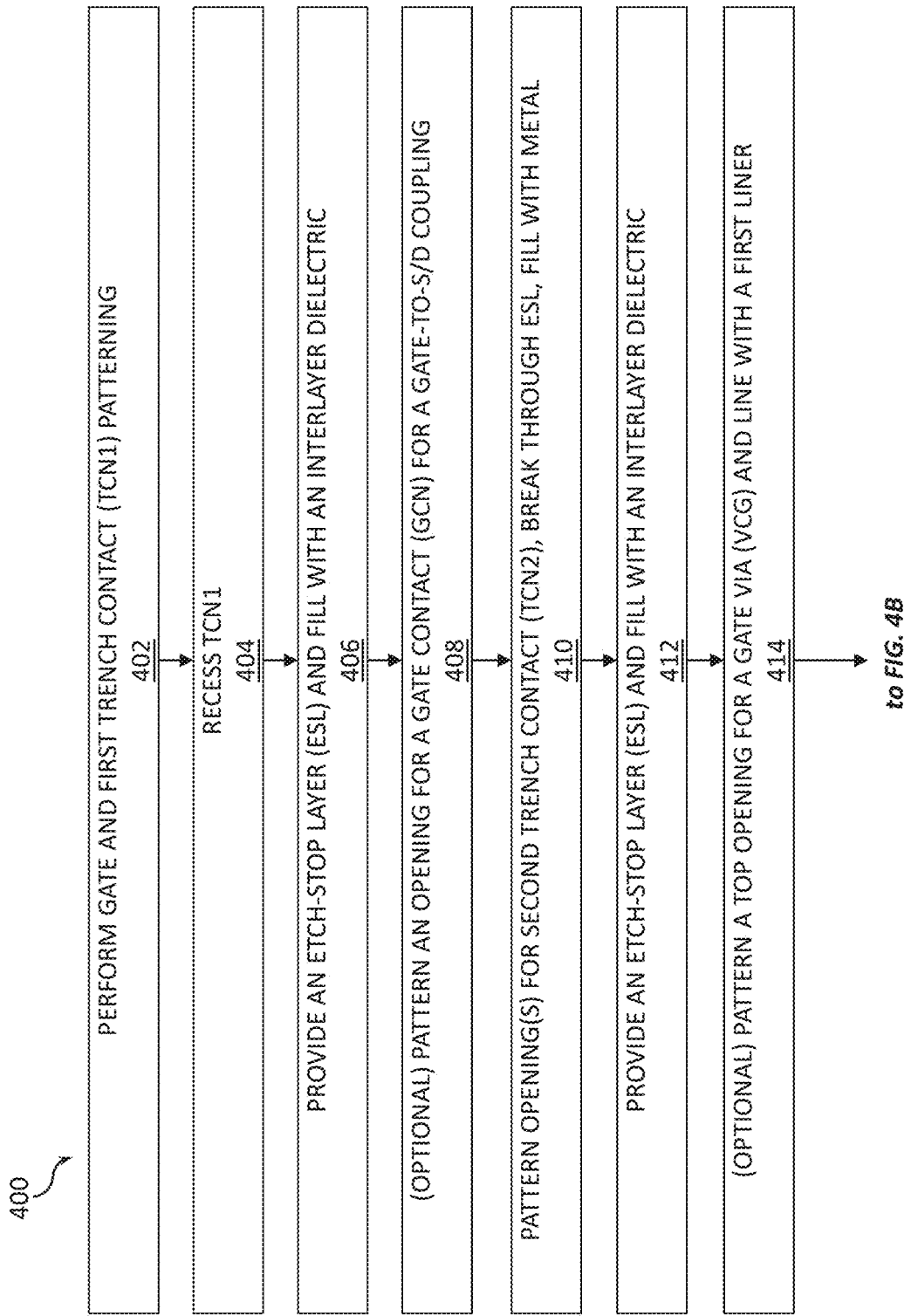
FIGS. 4A-4B provide a flow diagram of an example method of manufacturing an IC structure with a transistor arrangement with one or more stacked trench contacts and/or one or more gate straps, according to one embodiment of the disclosure.
Figure 4B:
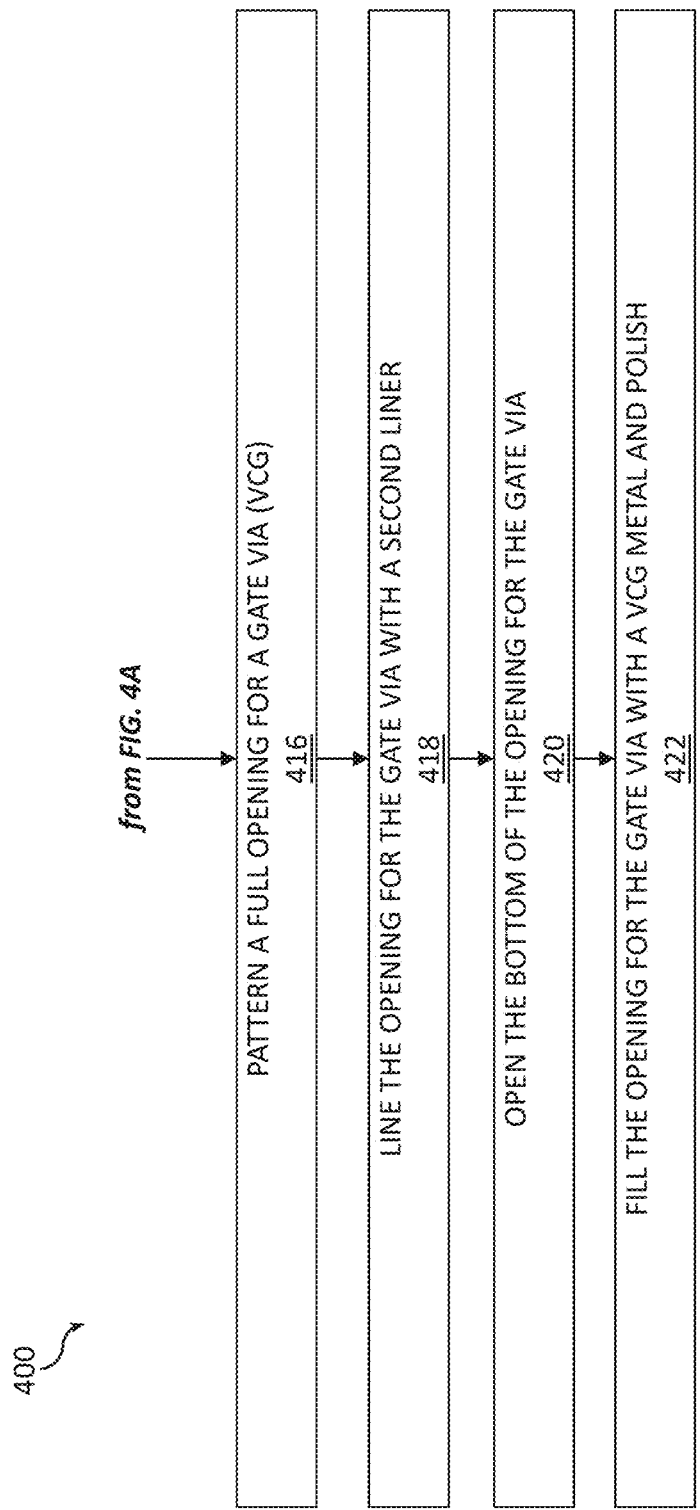

FIGS. 4A-4B provide a flow diagram of an example method 400 of manufacturing an IC structure with a transistor arrangement with one or more stacked trench contacts and/or one or more gate straps, according to one embodiment of the disclosure. For example, the method 400 may be used to manufacture an IC structure such as the IC structure 300, with a transistor arrangement such as the transistor arrangement 320, described herein.

Although the operations of the method 400 are illustrated once each and in a particular order, the operations may be performed in any suitable order and repeated as desired. For example, one or more operations may be performed in parallel to manufacture, substantially simultaneously, multiple transistor arrangements with one or more stacked trench contacts and/or one or more gate straps as described herein. In another example, the operations may be performed in a different order to reflect the structure of a particular device assembly in which one or more transistor arrangements with one or more stacked trench contacts and/or one or more gate straps as described herein will be included.

In addition, the example manufacturing method 400 may include other operations not specifically shown in FIG. 4, such as various cleaning or planarization operations as known in the art. For example, in some embodiments, a support structure, as well as layers of various other materials subsequently deposited thereon, may be cleaned prior to, after, or during any of the processes of the method 400 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/devices described herein may be planarized prior to, after, or during any of the processes of the method 400 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 400 may be illustrated with reference to the example embodiments shown in FIGS. 5-8, illustrating cross-sectional side views for various stages in the manufacture of an example IC structure with a transistor arrangement with one or more stacked trench contacts and/or one or more gate straps, in accordance with various embodiments, but the method 400 may be used to manufacture any other suitable IC structures having one or more transistor arrangements with one or more stacked trench contacts and/or one or more gate straps according to any embodiments of the present disclosure. In particular, FIGS. 5-8 illustrate cross-sectional side views of various embodiments of the transistor arrangement 320 of FIG. 3, with the cross-sections of the transistor arrangement 320 taken along the length of the fin 104-5 (i.e., cross-sections along the x-z planes that contain the fin 104-5). Similar to FIGS. 2-3, a number of elements referred to in the description of FIGS. 5-8 with reference numerals are illustrated in these figures with different patterns, with a legend showing the correspondence between the reference numerals and patterns being provided at the bottom of each drawing page containing FIGS. 5-8.

The method 400 may begin with a process 402 that includes performing gate and TCN1 patterning.

The process 402 is shown in FIG. 4A, and an example result of this process is illustrated with an IC structure 502, shown in FIG. 5A. The process 402 may include, first, providing one or more (typically, a plurality) of fins over a support structure, then providing one or more (typically, a plurality) of metal gate lines as ridges crossing and wrapping around upper portions of the fins, and then performing TCN1 patterning in regions between the adjacent metal gate lines. The IC structure 502 illustrates a support structure 532 and a channel material 534 of one of the fins 104 (e.g., of the fin 104-5, shown in FIG. 3), extending away from the support structure 532. The IC structure 502 further illustrates three gates 536 (labeled as gates 536-1, 536-2, and 536-3) enclosing the upper portion of the channel material 534, the three gates corresponding to the three metal gate lines 212 crossing the fin 104-5 in the transistor arrangement 320 of FIG. 3, with a gate spacer 538 provided on the sidewalls of the adjacent gates 536, as is known in the art. The IC structure 502 also illustrates S/D contacts 542, provided in the fin 104 between the adjacent gates 536. The support structure 532 may be implemented as the base 102, described above. The channel material 534 may be implemented as described above with reference to the channel portion of the fin 104. Each of the gates 536 may include any of the gate electrode materials as described above with reference to the gate electrode 112, and, optionally, also a gate dielectric material as described above with reference to the gate dielectric 110. The gate spacer 538 may be implemented as described above with reference to the gate spacer surrounding the gate stack 108. The S/D contacts 542 may be implemented as described above with reference to the S/D regions 114. Methods for providing the fins 104, the gates 536 with the gate spacers 538, and the S/D contacts 542 are known in the art and, therefore, are not described here in detail.

What is different in the IC structure from conventional implementations of fins with gates is that the gates 536 are not only enclosed by the gate spacer 538 on their sidewalls, but also with a gate cap 540, provided over the sidewalls and over the tops of the gates 536. The S/D contacts 542 may then be provided between the instances of the gate cap 540 associated with adjacent gates 536. A TCN1 material 544 may then be provided above the S/D contacts 542 (e.g., to be in contact with the S/D contacts 542), in between the instances of the gate cap 540 associated with adjacent gates 536. A dielectric material (e.g., an interlayer dielectric (ILD)) 546 may be provided over other portions of the IC structure, e.g., as shown on the left side of FIG. 5A. The gate cap 540 may include any of the materials described above with reference to the gate spacer surrounding the gate stack 108, although the exact material composition of the gate spacer 538 and the gate cap 540 may be different in some embodiments. The gate cap 540 may be provided to reduce or eliminate the probability of the TCN2 material, provided in a later process of the method 400, shorting (i.e., making an electrical connection or a short circuit) to the gate electrode material of the gates 536, e.g., if the gate spacer 538 is too thin or becomes worn out with time (because dielectric materials may break down over time, causing reliability issues). The ILD material 546 may be implemented as the dielectric material 206 shown in FIG. 3. An etch-stop material 535 may be provided, e.g., as a thin layer, between a portion of the channel material 534 of the fin and the ILD material 546. In some embodiments, the etch-stop material 535 may include the gate cap 540. In other embodiments, the etch-stop material 535 may include materials such as silicon nitride, or silicon carbon nitride. The TCN1 material 544 may be implemented as the TCN1 material 304 shown in FIG. 3, and may include any suitable electrically conductive material, such as one or more metals or metal alloys with metals such as copper, ruthenium, palladium, platinum, cobalt, nickel, hafnium, zirconium, titanium, tantalum, molybdenum, and aluminum. In some embodiments, the TCN1 material 544 may include one or more electrically conductive alloys, oxides (e.g., conductive metal oxides), carbides (e.g., hafnium carbide, zirconium carbide, titanium carbide, tantalum carbide, and aluminum carbide), or nitrides (e.g. hafnium nitride, zirconium nitride, titanium nitride, tantalum nitride, and aluminum nitride) of one or more metals.

Performing gate and TCN1 patterning in the process 402 may include using any suitable patterning techniques to define the locations and the dimensions of the gates 536 and the TCN2 material 544, such as, but not limited to, photolithographic or electron-beam (e-beam) patterning, possibly in conjunction with the use of one or more masks. Various dielectric materials as described herein, e.g., the gate cap 540, may be deposited using any suitable deposition technique such as spin-coating, dip-coating, physical vapor deposition (PVD) (e.g., evaporative deposition, magnetron sputtering, or e-beam deposition), or chemical vapor deposition (CVD). Various conductive materials as described herein, e.g., the TCN1 material 544, may be deposited using any suitable deposition technique such as PVD, CVD, or atomic layer deposition (ALD). The process 402 may also include using any suitable polishing techniques such as CMP to ensure that the upper surface of the TCN1 material 544 is flush with the upper surface of the gate cap 540. The etch-stop material 535 may be deposited using any suitable deposition technique such as ALD, CVD, etc.

The method 400 may then proceed with a process 404 that includes recessing the TCN1 material 544 provided above the S/D contacts 542 in the process 402 so that the upper surface of the TCN1 material 544 is below the upper surfaces of the gate electrode material of the gates 536. The process 404 is shown in FIG. 4A, and an example result of this process is illustrated with an IC structure 504, shown in FIG. 5B, where recesses 533 are illustrated. In particular, a recess 533-1 may be between the gates 536-1 and 536-2, and a recess 533-2 may be between the gates 536-2 and 536-3. In some embodiments, the recesses 533 may have a depth 535 of at least about 5 nanometers, including all values and ranges therein, e.g., at least about 10 nanometers, e.g., between about 5 and 20 nanometers. The recesses 533 may be provided to reduce or eliminate the probability of the VCG material, provided in a later process of the method 400, shorting to the TCN1 material 544, e.g., if a liner material that will also be provided in a later process of the method 400 to separate the VCG material and the TCN1 material 544 is too thin or becomes worn out with time. In some embodiments, the recesses 533 may be formed in the process 404 using any suitable etch-selective process that etches the electrically conductive material of the TCN1 material 544 without substantially etching the dielectric materials of the gate cap 540 and the dielectric 546 since conductive materials and dielectric materials are sufficiently etch-selective (where two materials may be described as "sufficiently etch-selective" if etchants used to etch one material do not substantially etch the other material, and vice versa).

The method 400 may further include a process 406, in which an etch-stop layer and an ILD material are provided over the IC structure formed in the process 404. The process 406 is shown in FIG. 4A, and an example result of this process is illustrated with an IC structure 506, shown in FIG. 5C, where a new layer of the etch-stop material 535 (labeled as "535-2") is illustrated to be provided over all upper surfaces of the IC structure 504 of FIG. 5B and then the ILD material 546 is provided over the etch-stop material 535-2.

Figure 5D:
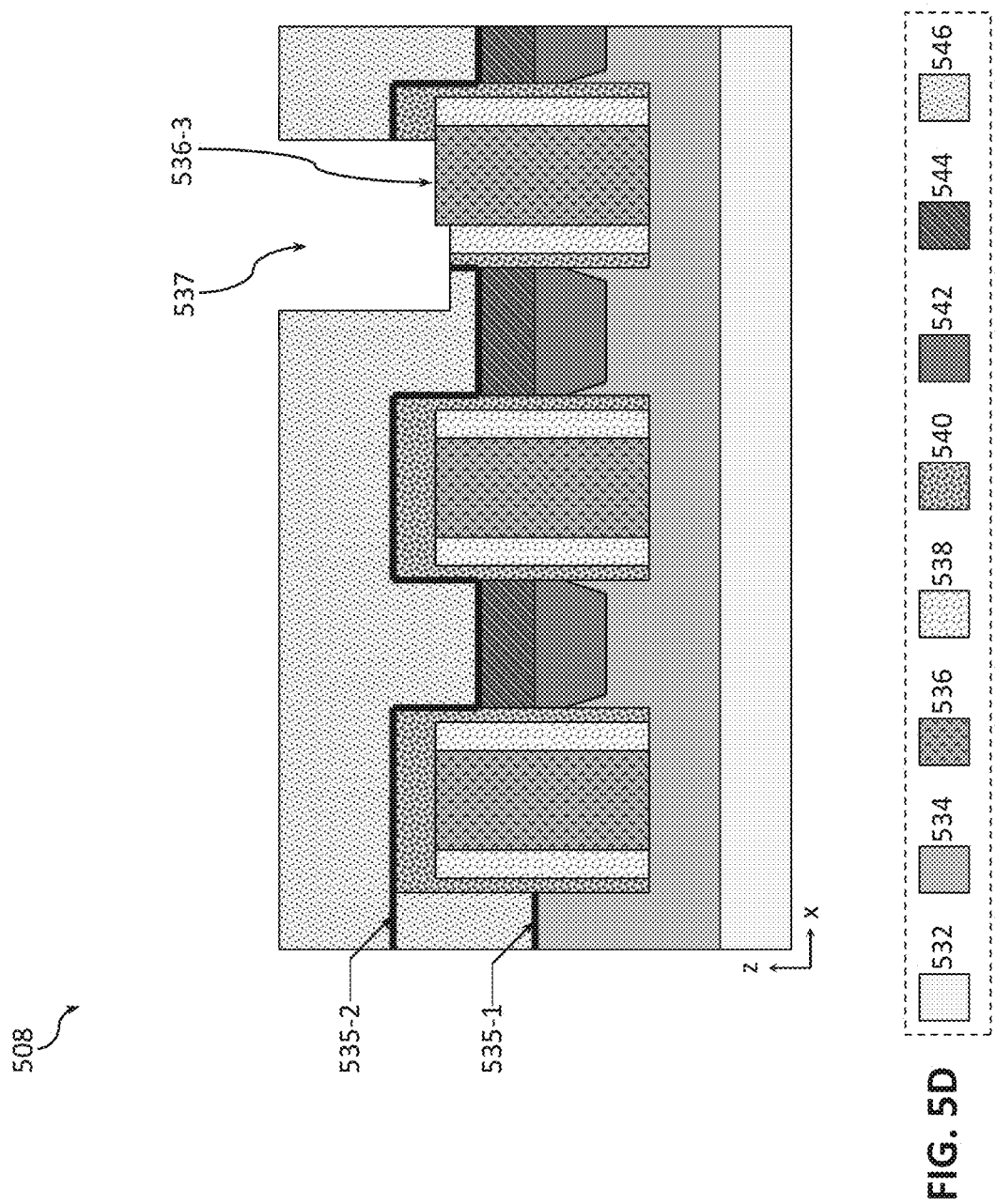

In case the design of the transistor arrangement 320 is such that a gate of one transistor is coupled to a S/D contact of another (i.e., for the optional embodiments of gate-to-S/D coupling for one of the transistors of the transistor arrangement 320), the method 400 may also include a process 408, in which an opening is patterned for a gate contact (GCN) for such a gate-to-S/D coupling. The process 408 is shown in FIG. 4A, and an example result of this process is illustrated with an IC structure 508 of FIG. 5D, showing an opening 537 formed to in the ILD material 546 to expose a portion of the gate 536-3. In some embodiments, the process 408 may include performing an anisotropic etch, possibly using a sequence of different etchants, to selectively etch through the ILD material 546 above the etch-stop material 535-2, then through the etch-stop material 535-2, and, finally, through the gate cap 540 to expose at least a portion of the upper surface of the gate electrode material of the gate 536-3 (e.g., the etch of the process 408 may be etch-selective with respect to the gate electrode material of the gate 536-3). Ideally, it may be desirable to provide the opening 537 directly over and aligned with the gate electrode material of the gate 536-3, e.g., using a suitable mask. However, such alignment may be difficult to achieve in practice. Therefore, FIG. 5D illustrates a result of performing the process 408 if the opening 537 is somewhat misaligned with the gate electrode material of the gate 536-3. In particular, the opening 537 is shifted to the left with respect to the center of the gate electrode material of the gate 536-3, resulting in the opening 537 extending down on the side of the gate electrode material of the gate 536-3 (due to the anisotropic etch process that is etch-selective with respect to the gate electrode material of the gate 536-3). Also the width of the opening 537 (a dimension measured along the x-axis of the example coordinate system shown in FIG. 5) may, but does not have to be, the same as the width of the gate electrode material of the gate 536-3.

In some embodiments, the anisotropic etch of any of the processes of the method 400 may include an etch that uses etchants in a form of e.g., chemically active ionized gas (i.e., plasma) using e.g., bromine (Br) and chloride (Cl) based chemistries. In some embodiments, during the anisotropic etch of any of the processes of the method 400, the IC structure may be heated to elevated temperatures, e.g., to temperatures between about room temperature and 200 degrees Celsius, including all values and ranges therein, to promote that byproducts of the etch are made sufficiently volatile to be removed from the surface. In some embodiments, the anisotropic etch of any of the processes of the method 400 may include a dry etch, such as radio frequency (RF) reactive ion etch (RIE) or inductively coupled plasma (ICP) RIE. Although not specifically shown in the present drawings, in various embodiments, any suitable patterning techniques may be before performing the anisotropic etch of any of the processes of the method 400 to define the locations and the dimensions of the openings to be etched.

Figure 5E:
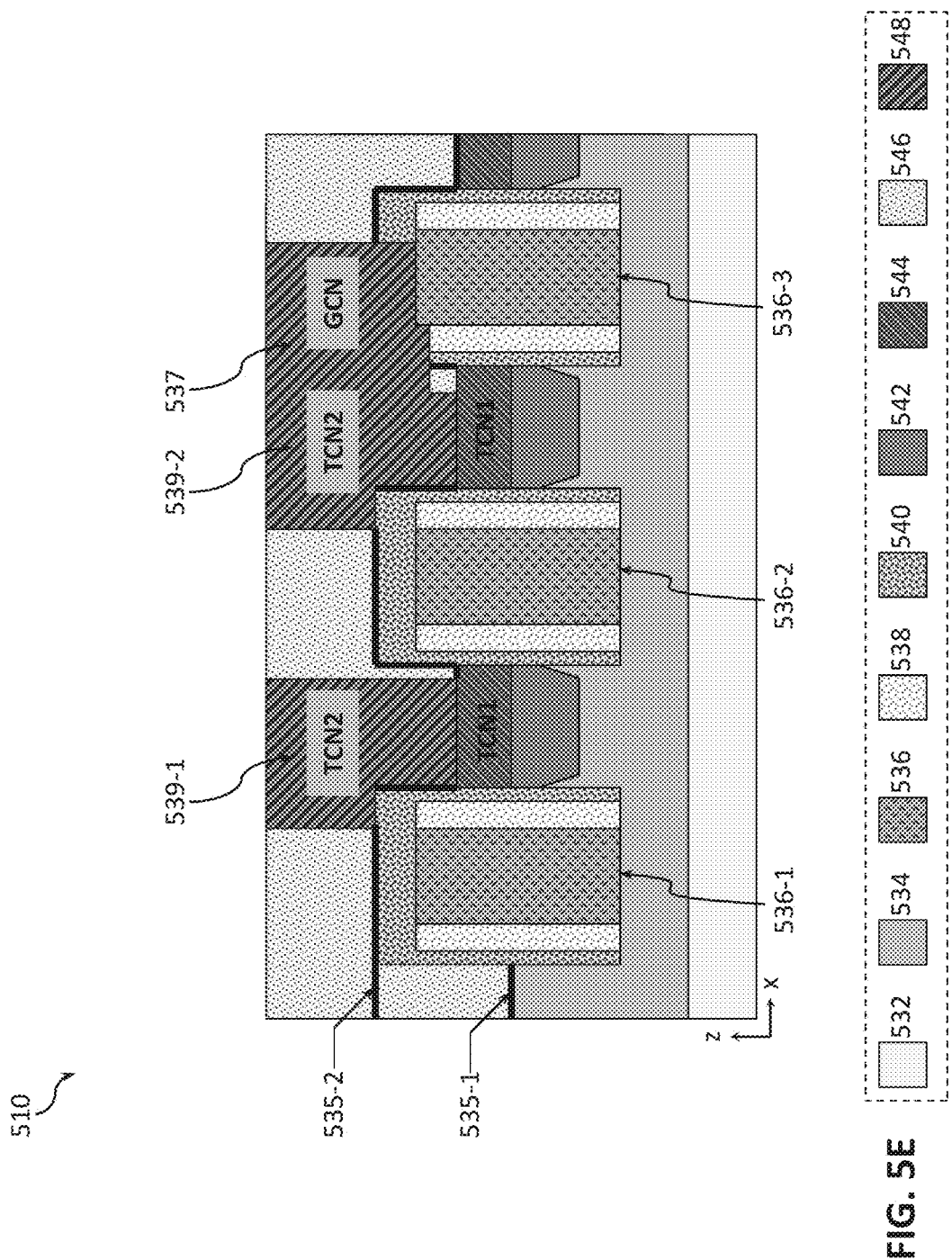
Figure 5F:
Figure 5G:
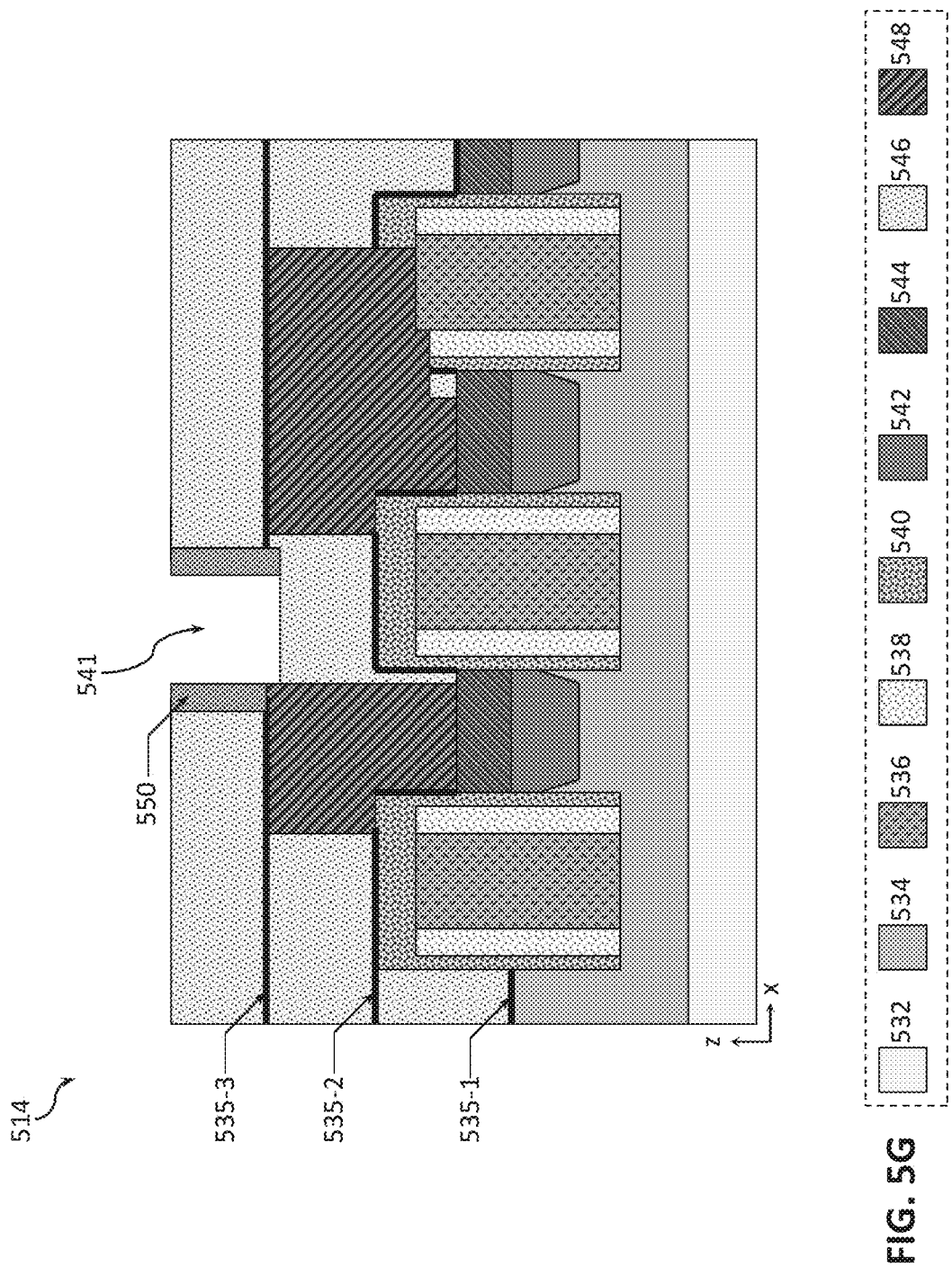

The method 400 may further include a process 410, in which one or more openings are patterned for a second trench contact (TCN2) and filled with a TCN2 material. The process 410 is shown in FIG. 4A, and an example result of this process is illustrated with an IC structure 510 of FIG. 5E, showing openings 539-1 and 539-2, filled with a TCN2 material 548. The opening 539-1 is, ideally, provided directly over and aligned with the S/D contact 542 between the gates 536-1 and 536-2, while the opening 539-2 is, ideally, provided directly over and aligned with the S/D contact 542 between the gates 536-2 and 536-3 (the individual ones of the gates 536 not specifically labeled in FIG. 5E in order to not clutter the drawing). However, such alignment may be difficult to achieve in practice and, therefore, FIG. 5E illustrates a result of performing the process 410 if the openings 539 were somewhat misaligned with respect to said S/D contacts 542 (in particular, similar to the opening 537, both of the openings 539 are shifted to the left, although the misalignment of the openings 537 and/or 539 may be different in other embodiments of the method 400). As shown in FIG. 5E, each of the openings 539 may expose at least a portion of the TCN1 material 544 provided over said S/D contacts 542 and, in general, the width of the openings 539 (a dimension measured along the x-axis of the example coordinate system shown in FIG. 5) may, but does not have to be, the same as the width of the S/D contacts 542. For the embodiments where the opening 537 was formed in the process 408, the opening 539-2 may overlap with the opening 537, thus forming one combined opening. In some embodiments, the process 410 may include performing an anisotropic etch, possibly using a sequence of different etchants, to selectively etch through the ILD material 546 above the etch-stop material 535-2, then through the etch-stop material 535-2, and, finally, through the ILD material 546 between the gates 536, to expose at least a portion of the TCN1 material 544. In some embodiments, the anisotropic etch of the process 410 may be etch-selective with respect to the gate cap 540 so that, if the openings 539 are misaligned (e.g., as shown in FIG. 5E) so that a portion of the gate cap 540 is exposed when the etch-stop material 535-2 is removed at the top of the gate cap 540, then the exposed gate cap 540 is not substantially etched. In some embodiments, the etch-stop material 535-2 may be a thin highly selective metal oxide material which may be physically sputtered away during the etch of the process 410, so only its thickness is removed with little penetration into the gate cap 540, as is shown in FIG. 5E. As shown in FIG. 5E, some of the etch-stop material 535-2 may remain on the sidewalls of the gate cap 540 within the openings 539, being one of the features in the final product, indicative of the use of the method 400.

FIG. 5E further illustrates the TCN2 material 548, which may include any of the electrically conductive materials described above, and which may, but does not have to, have the same material composition as the TCN1 material 544, provided in the openings 539 formed in the process 410 and also in the opening 537 if the process 408 was performed. By virtue of the opening 537 being combined with the opening 539-2 and, together, filled with the TCN2 material 548, an electrical connection is made between the gate electrode material of the gate 536-3 and the S/D contact 542 between the gates 536-2 and 536-3, thus realizing the gate-to-S/D coupling in the transistor arrangement 320. A portion of the TCN2 material 548 in the opening 539-2 (i.e., over the S/D contact 542 between the gates 536-2 and 536-3) forms a trench contact TCN2 to said S/D contact 542, while a portion of the TCN2 material 548 provided in the opening 537 (i.e., over the gate electrode material of the gate 536-3) forms a gate contact GCN for the gate 536-3, where the gate contact GCN is coupled to the trench contact TCN2. A portion of the TCN2 material 548 in the opening 539-1 forms a trench contact TCN2 to the S/D contact 542 between the gates 536-1 and 536-2. The gate cap 540 may help reduce or eliminate the probability of the portion of the TCN2 material 548 in the opening 539-1 shorting to the gate electrode material of the gate 536-1 (i.e., the gate cap 540 is between, and, therefore, electrically isolates, the TCN2 material 548 in the opening 539-1 and the gate electrode material of the gate 536-1, which is characteristic of the use of the method 400). Trench contacts TCN1 and TCN2 are labeled in FIG. 5E. Thus, FIG. 5E illustrates two instances of stacked trench contacts: one is a stack of trench contacts TCN1 and TCN2 to electrically couple to the S/D contact 542 between the gates 536-1 and 536-2 and another stack of trench contacts TCN1 and TCN2 is to electrically couple to the S/D contact 542 between the gates 536-2 and 536-3. FIG. 5E also illustrates that the gate contact GCN (also labeled in FIG. 5E) may be provided of the same material as the TCN2 to electrically couple to the S/D contact 542 between the gates 536-2 and 536-3, which is a feature that is characteristic of the use of the method 400.

The method 400 may further include a process 412, in which another etch-stop layer and another layer of an ILD material are provided over the IC structure formed in the process 410. The process 412 is shown in FIG. 4A, and an example result of this process is illustrated with an IC structure 512, shown in FIG. 5F, where a new layer of the etch-stop material 535 (labeled as "535-3") is illustrated to be provided over all upper surfaces of the IC structure 510 of FIG. 5E and then the ILD material 546 is provided over the etch-stop material 535-3.

The method 400 may then proceed with an optional process 414 that includes patterning a top opening for a future gate via over the gate 536-2 and lining the top opening with a first liner material. The process 414 is shown in FIG. 4A, and an example result of this process is illustrated with an IC structure 514, shown in FIG. 5G, where an opening 541 is illustrated, which opening is referred to as a "top opening" because it is provided in the ILD material 546 above the etch-stop material 535-3, breaking through the etch-stop material 535-3, and only partially extending into the ILD material 546 above the etch-stop material 535-2. The sidewalls of the opening 541 are lined with a first liner material 550, which may include any of the dielectric spacer materials described above. The first liner material 550 may be used to reduce or eliminate the probability of the VCG material, provided in a later process of the method 400, shorting to the TCN2 material 548, e.g., if a second liner material that will be provided in a later process of the method 400 to separate the VCG material and the TCN2 material 548 is too thin or becomes worn out with time. In some embodiments, the top opening 541 may be formed in the process 414 using a suitable anisotropic etch process (e.g., etch-selective with respect to the TCN2 material 548). In some embodiments, the sidewalls of the opening 541 may be lined with the first liner material 550 using any suitable conformal deposition process, such as ALD. However, in other embodiments, any other suitable deposition techniques may be used to line the sidewalls of the opening 541 with the first liner material 550, such as spin-coating, dip-coating, PVD, or CVD. In some embodiments, the process 414 may include depositing the first liner material 550 on sidewalls and bottom of the opening 541 (as well as on the upper surfaces of the IC structure 514), followed by an anisotropic etch to remove the first liner material 550 from the bottom of the opening 541 and to remove excess of the first liner material 550 from the upper surfaces of the IC structure 514 (similar to the process described below for the second liner material 552).

Figure 5H:
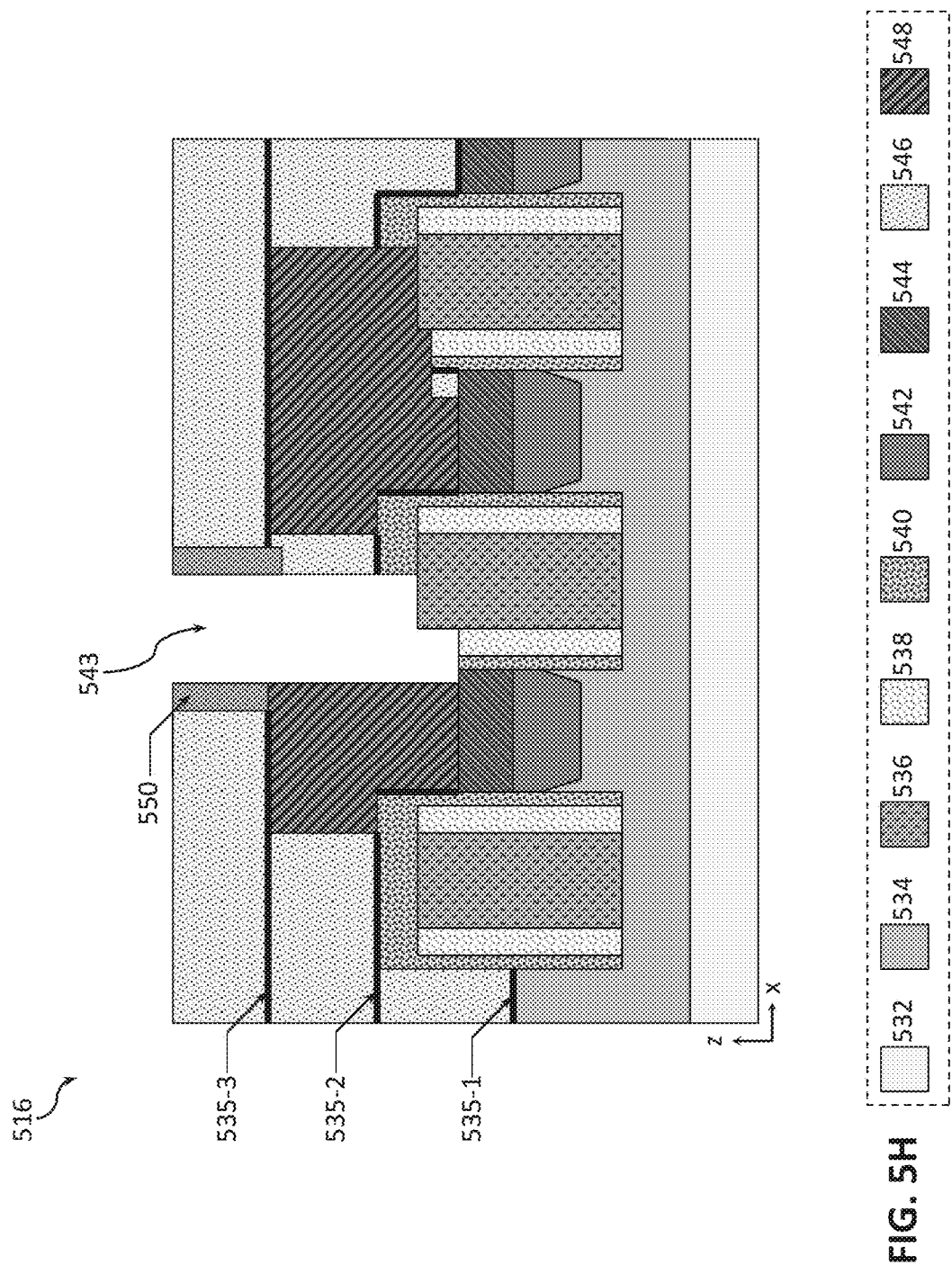
Figure 51:
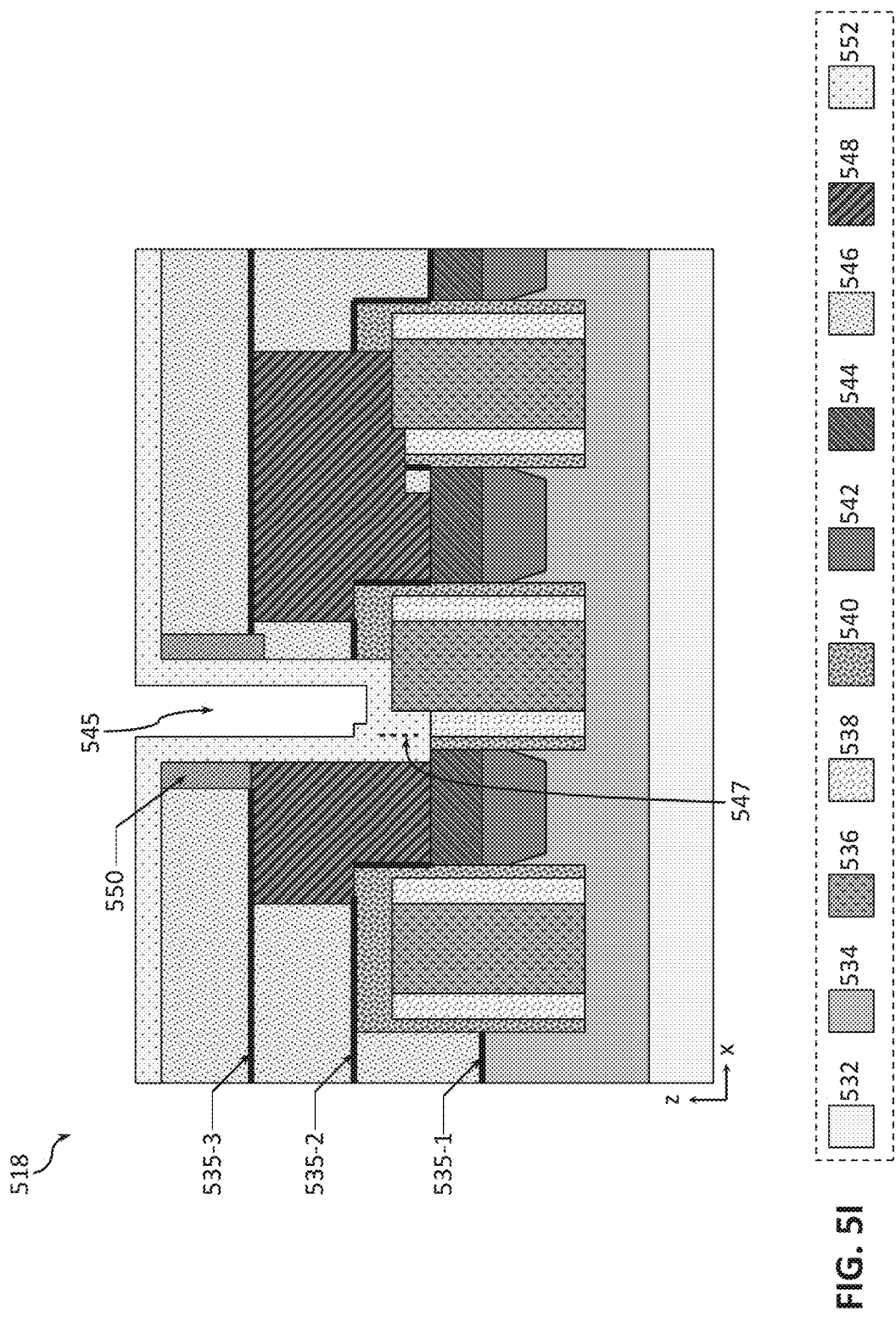

The method 400 may then proceed with a process 416 that includes patterning a full opening for a future gate via over the gate 536-2. The process 416 is shown in FIG. 4B, and an example result of this process is illustrated with an IC structure 516, shown in FIG. 5H, where an opening 543 is illustrated, which opening is referred to as a "full opening" because it is provided in the ILD material 546 above the etch-stop material 535-3, breaking through the etch-stop material 535-3, extending through all of the ILD material 546 above the etch-stop material 535-2, breaking through the etch-stop material 535-2, and removing whatever the dielectric materials are exposed after the etch-stop material 535-2 has been removed. In some embodiments, the process 416 may include performing an anisotropic etch, possibly using a sequence of different etchants, to selectively etch through these materials to expose at least a portion of the upper surface of the gate electrode material of the gate 536-2 (e.g., the etch of the process 416 may be etch-selective with respect to the gate electrode material of the gate 536-2). Ideally, it may be desirable to provide the opening 543 directly over and aligned with the gate electrode material of the gate 536-2, e.g., using a suitable mask. However, such alignment may be difficult to achieve in practice. Therefore, FIG. 5H illustrates a result of performing the process 416 if the opening 543 is somewhat misaligned with the gate electrode material of the gate 536-2. In particular, the opening 543 is shifted to the left with respect to the center of the gate electrode material of the gate 536-2, resulting in the opening 543 extending down on the side of the gate electrode material of the gate 536-2 (due to the anisotropic etch process that is etch-selective with respect to the gate electrode material of the gate 536-2). Also the width of the opening 543 (a dimension measured along the x-axis of the example coordinate system shown in FIG. 5) may, but does not have to be, the same as the width of the gate electrode material of the gate 536-2. If the process 414 was performed, then the process 416 may include performing an anisotropic etch that is etch-selective with respect to the gate electrode material of the gate 536-2 through the opening 541 formed in the process 414. In some embodiments, such an etch process may be etch-selective with respect to the first liner material 550 provided in the opening 541 formed in the process 414.

The method 400 may then proceed with a process 418 that includes lining the opening formed in the process 416 with a second liner material. The process 418 is shown in FIG. 4B, and an example result of this process is illustrated with an IC structure 518, shown in FIG. 5I, where sidewalls and bottom of the opening 543 are lined with a second liner material 552, thus forming a lined VCG opening 545 (which is an opening smaller than the opening 543). The second liner material 552 may include any of the dielectric spacer materials described above and may have material composition similar to, or different from, the material composition of the first liner material 550. When the opening 543 formed in the process 416 is misaligned as was described above, deposition of the second liner material 552 may result in formation of a seam 547 near the bottom of the lined VCG opening 545. The seam 547 may be seen as an interface where materials being deposited on both two sides of a trench or cavity structure, when the material thickness is greater than about half of the trench or cavity width. The seam 547 may not be there is the misalignment of the opening 543 is not large enough. In some embodiments, the second liner material 552 may be deposited in the process 418 using a conformal deposition technique such as ALD. However, in other embodiments, any other suitable deposition techniques may be used to line the sidewalls and bottom of the opening 543 with the second liner material 552, such as spin-coating, dip-coating, PVD, or CVD.

Figure 5J:
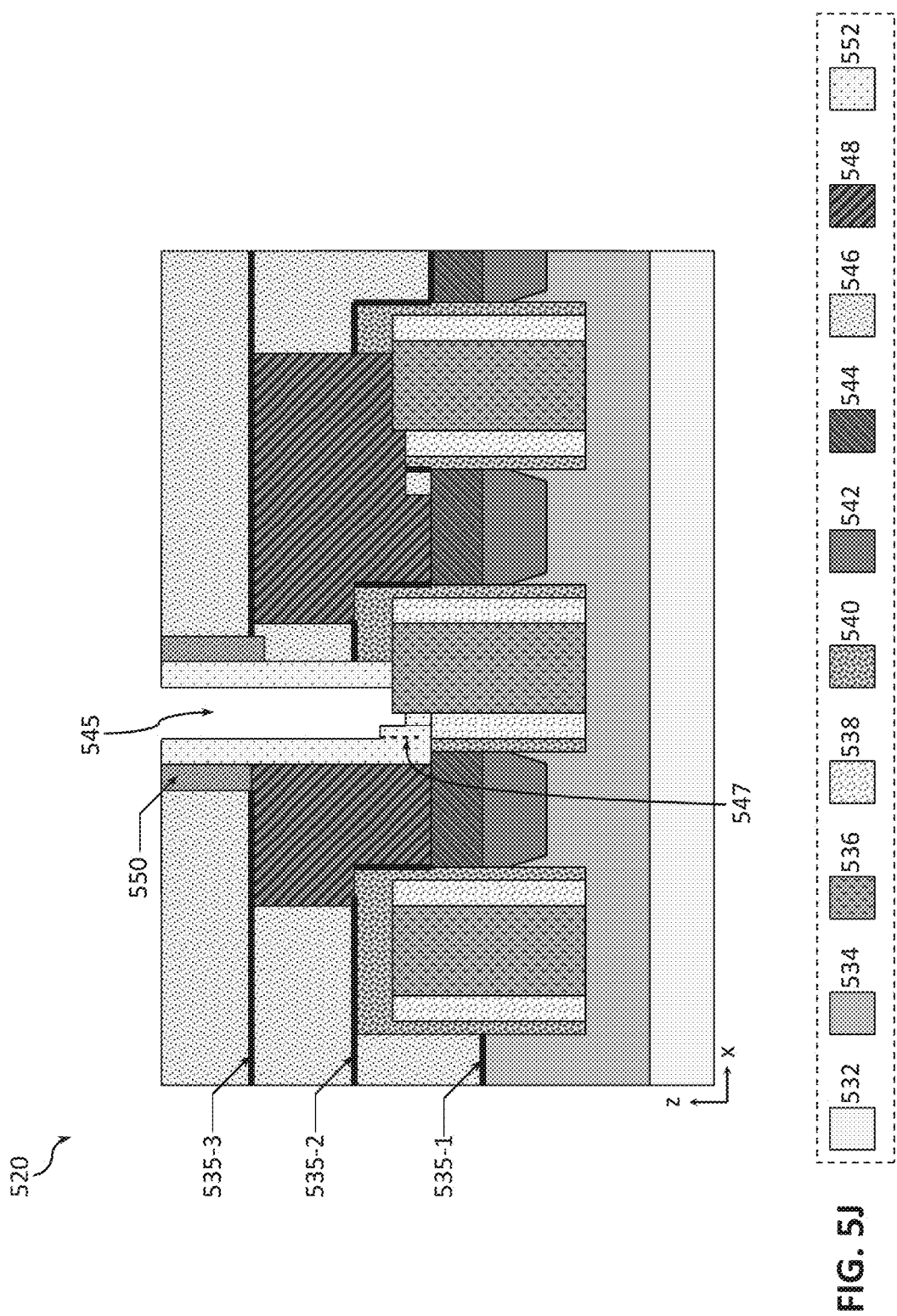

The method 400 may then proceed with a process 420 that includes removing the second liner material that was deposited at the bottom of the opening formed in the process 416. The process 420 is shown in FIG. 4B, and an example result of this process is illustrated with an IC structure 520, shown in FIG. 5J, illustrating that the second liner material 552 is removed from the bottom of the lined VCG opening 545. In some embodiments, the process 420 may include removing the second liner material 552 from all horizontal surfaces of the IC structure 518, i.e., also from the upper surfaces of the IC structure 518. In some embodiments, the process 420 may include an anisotropic etch process that may be etch-selective with respect to the gate electrode material of the gate 536-2. As shown in FIG. 5J, the process 420 opens the bottom of the lined VCG opening 545, thus exposing the gate electrode material of the gate 536-2 so that a gate via contact may be made thereto in a process 422.

Figure 5K:
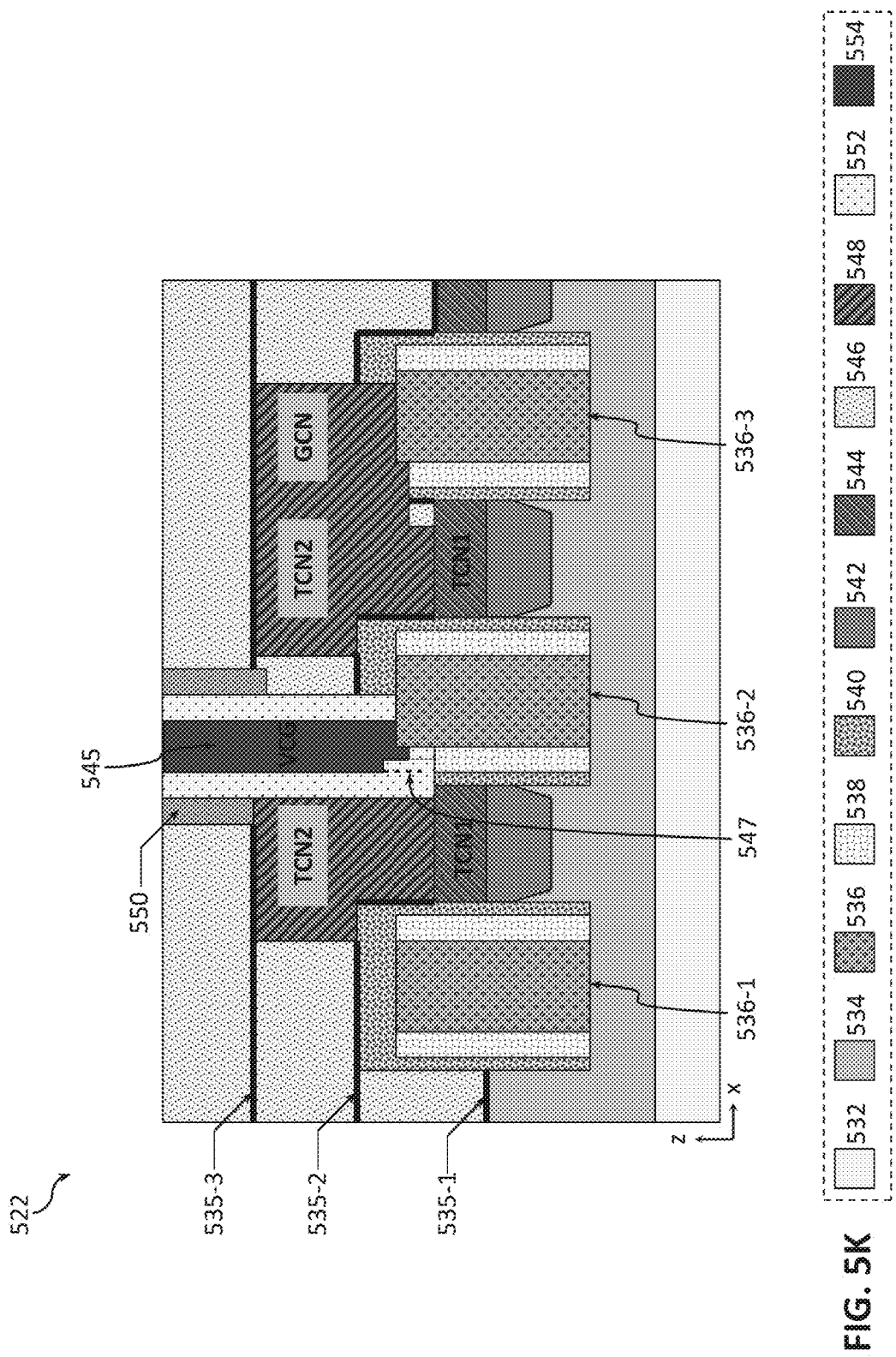

Finally, the method 400 may include a process 422, which includes filling the lined VCG opening 545 that resulted from the process 420 with an electrically conductive material for the VCG of the transistor arrangement 320 and, optionally, performing any suitable polishing process to remove excess of the VCG material. The process 420 is shown in FIG. 4B, and an example result of this process is illustrated with an IC structure 522, shown in FIG. 5K, illustrating that the opening 545 has been filled with the VCG material 554, which may include any of the electrically conductive materials described with reference to the TCN1 material 544. In various embodiments, material composition of the VCG material 554 may be the same or different from that of the TCN1 material 544 and/or that of the TCN2 material 548. The VCG material 554 in the opening 545 forms a gate contact via VCG, by being in contact with the gate electrode material of the gate 536-2. The gate contact via VCG (formed by the VCG material 554 in the opening 545), the gate contact GCN (formed by the TCN2 material 548 in the opening 537, as described above), and stacked trench contacts TCN2 and TCN1 (formed by the, respectively, TCN2 material 548 and the TCN1 material 544, as described above) are labeled in FIG. 5K, as well as the gates 536-1, 536-2, and 536-2.

As described above, the process 414 of the method 400 is optional. Example stages in the manufacture of a transistor arrangement using the method 400 without performing the process 414 are shown with the cross-sectional side views of FIGS. 6A-6D, according to other embodiments of the present disclosure.

Figure 6A:
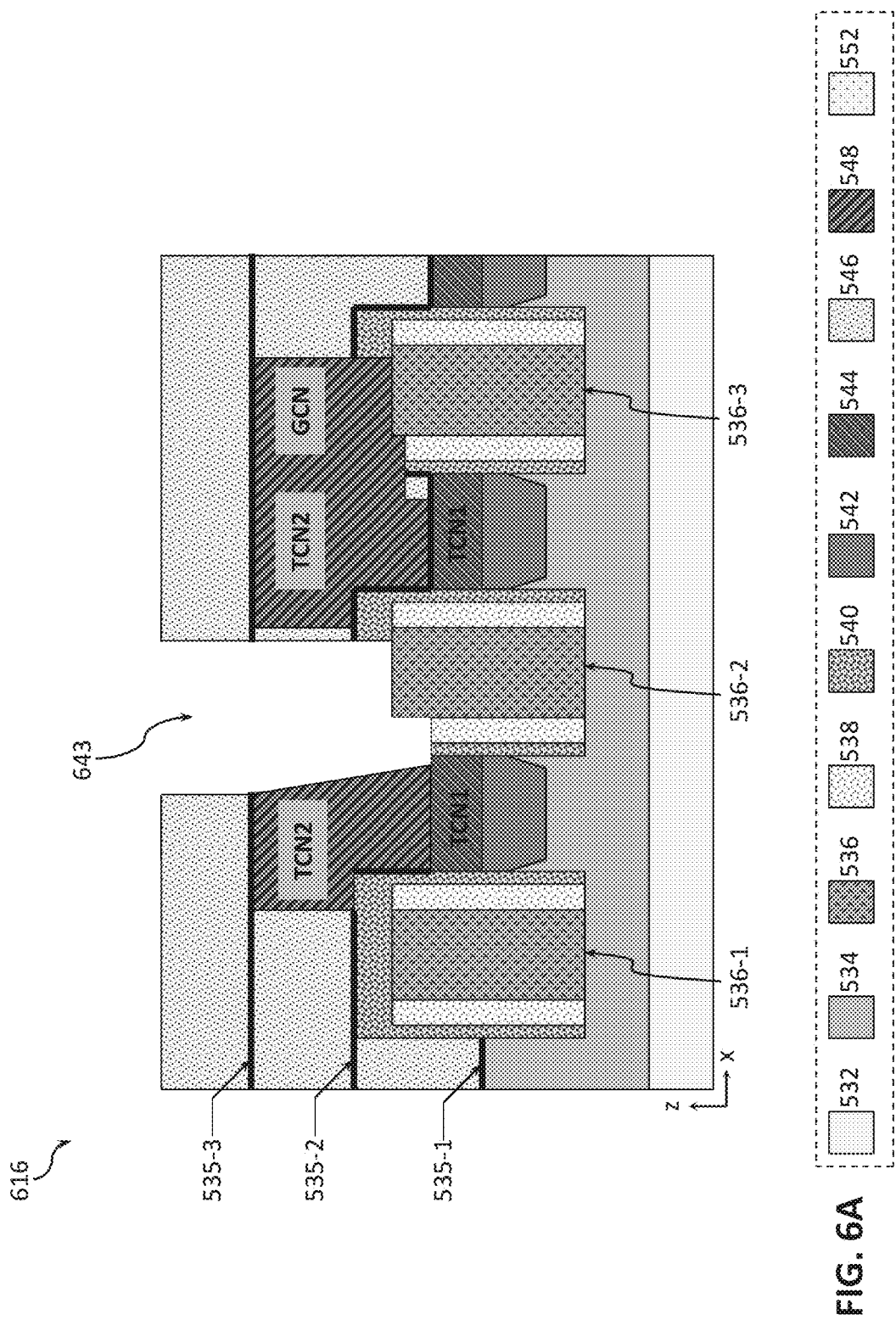
FIGS. 6A-6D are cross-sectional side views illustrating different example stages in the manufacture of an alternative transistor arrangement with one or more stacked trench contacts using the method of FIGS. 4A-4B, according to other embodiments of the present disclosure.

An IC structure 616, shown in FIG. 6A, is an example result of the process 416 performed on the IC structure 512 that resulted from the process 412 (i.e., the process 414 was not performed). In the IC structure 616, the opening 643 is similar to the opening 543 except that the opening 643 is formed without the first liner material 550 guiding the etch. As a consequence of not having the first liner material 550 covering the upper right corner of the TCN2 material 548, that corner may be clipped in the etch of the process 416, as is illustrated in FIG. 6A with a slanted profile of the TCN material 548 to which the opening 643 is aligned to (i.e., the substantially square corner of the IC structure 512 may be clipped in the process 416 to result in a slanted profile as shown in FIG. 6A).

Figure 6B:
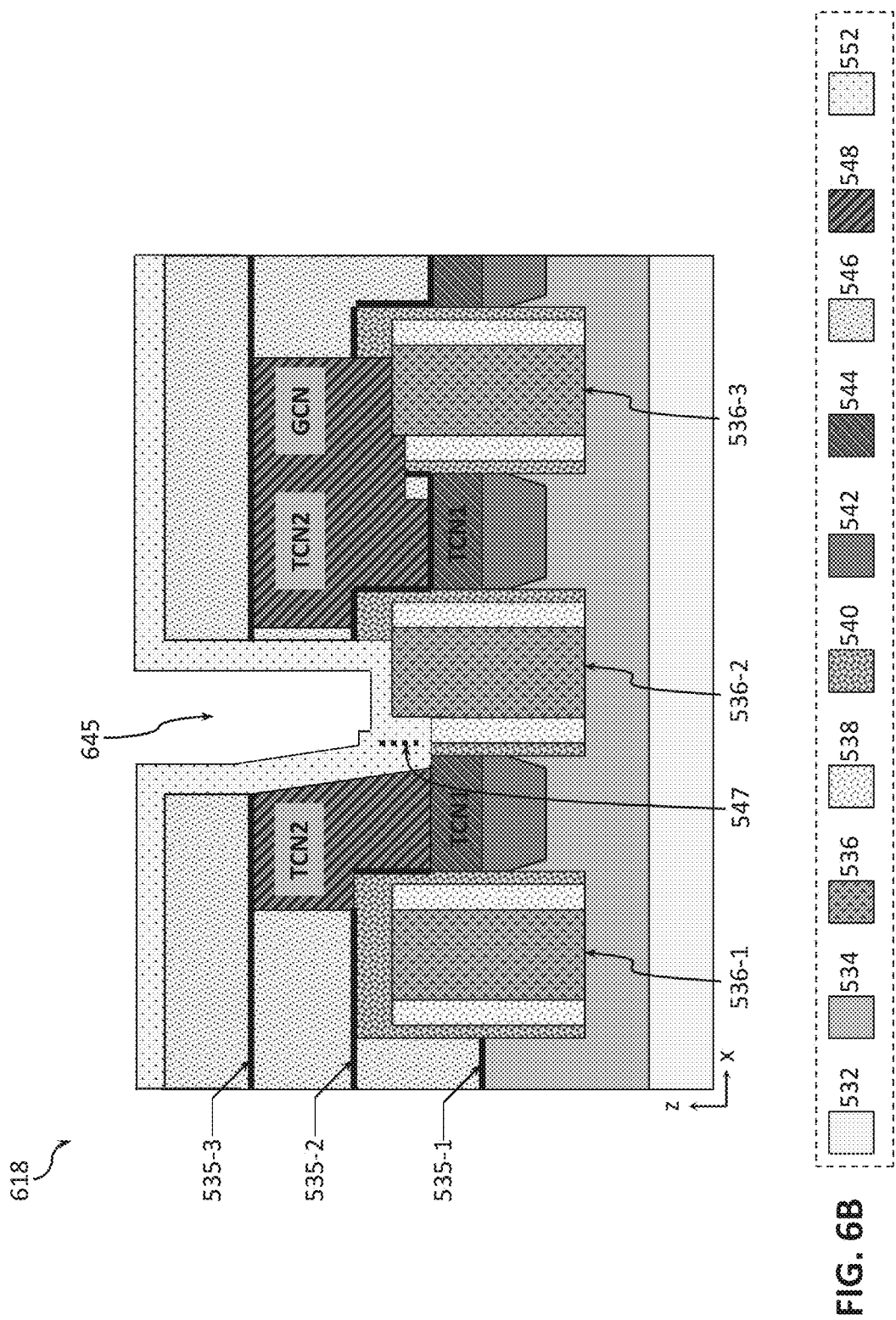

An IC structure 618, shown in FIG. 6B, is an example result of the process 418 performed on the IC structure 616, described above. The IC structure 618 illustrates an opening 645, similar to the opening 545, that is a result of lining the opening formed in the process 416 with the second liner material 552. Except for the differences described with respect to the IC structure 616, descriptions of the IC structure 518 are applicable to the IC structure 618 and, therefore, in the interests of brevity, are not repeated.

Figure 6C:
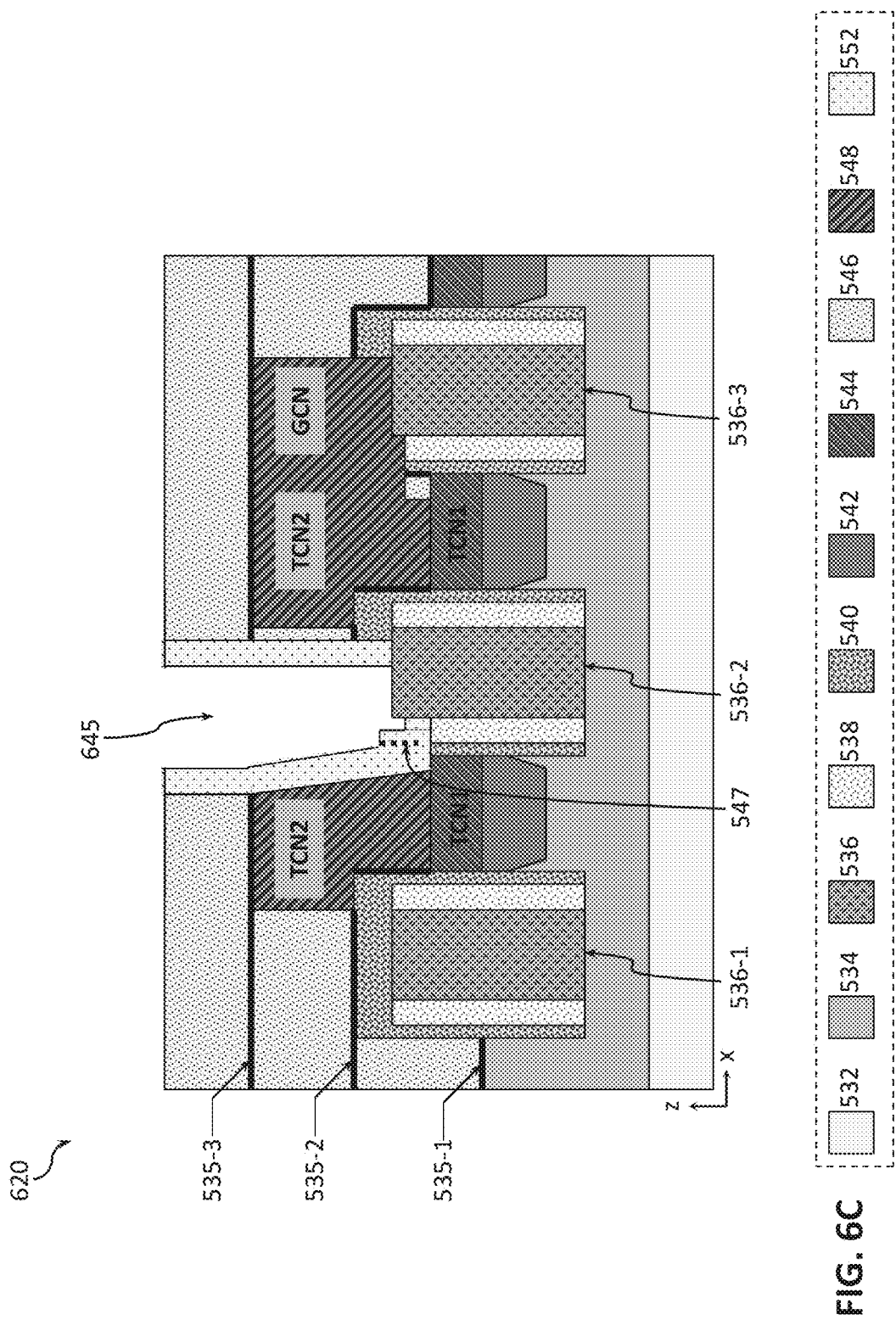

An IC structure 620, shown in FIG. 6C, is an example result of the process 420 performed on the IC structure 618, described above. Except for the differences described with respect to the IC structure 616, descriptions of the IC structure 520 are applicable to the IC structure 620 and, therefore, in the interests of brevity, are not repeated.

Figure 6D:
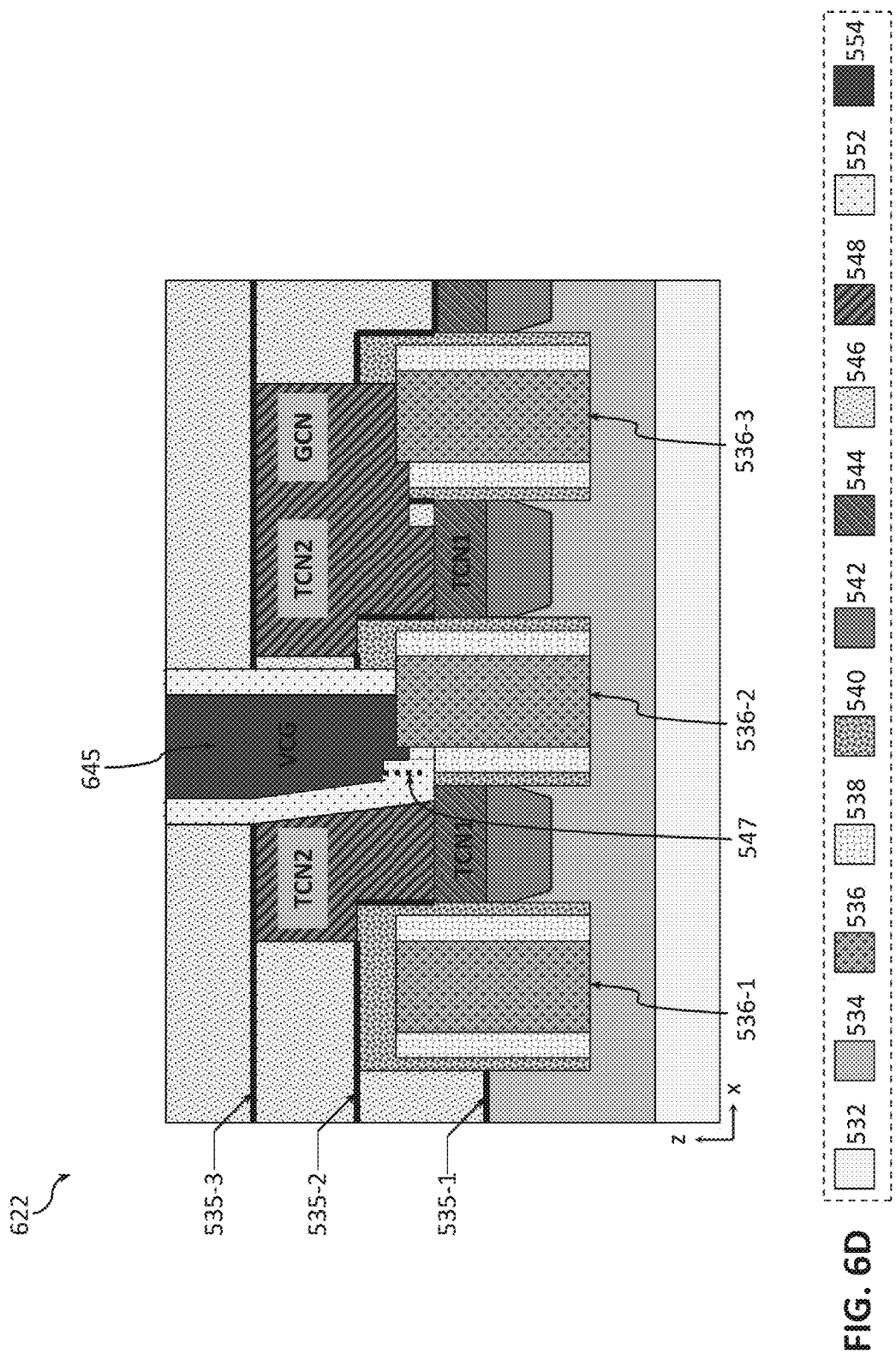

An IC structure 622, shown in FIG. 6D, is an example result of the process 422 performed on the IC structure 620, described above. Except for the differences described with respect to the IC structure 616, descriptions of the IC structure 522 are applicable to the IC structure 622 and, therefore, in the interests of brevity, are not repeated.

Figure 7A:
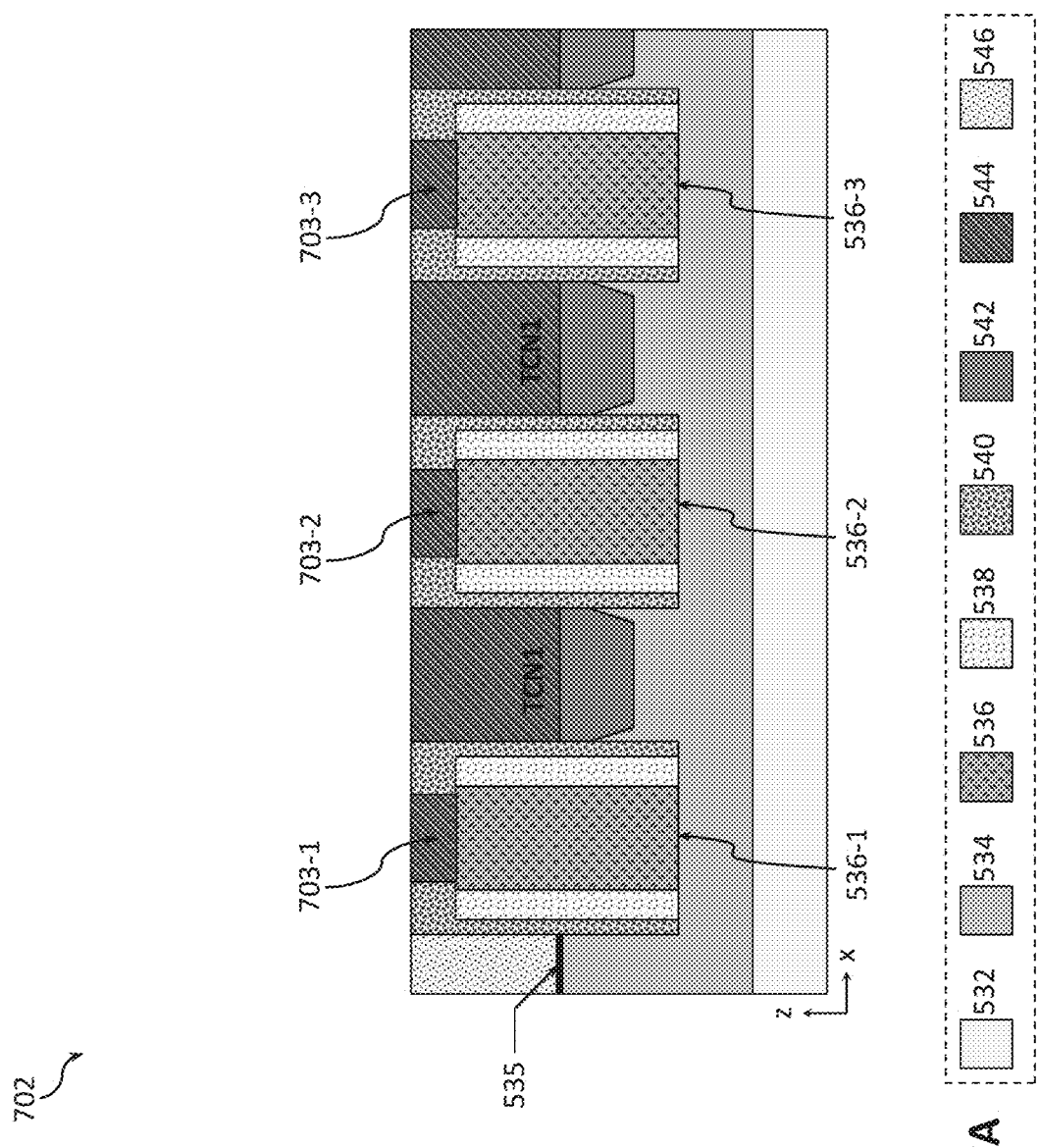
FIGS. 7A-7B are cross-sectional side views illustrating different example stages in the manufacture of a transistor arrangement with one or more gate straps using the method of FIGS. 4A-4B, according to some embodiments of the present disclosure.
Figure 7B:
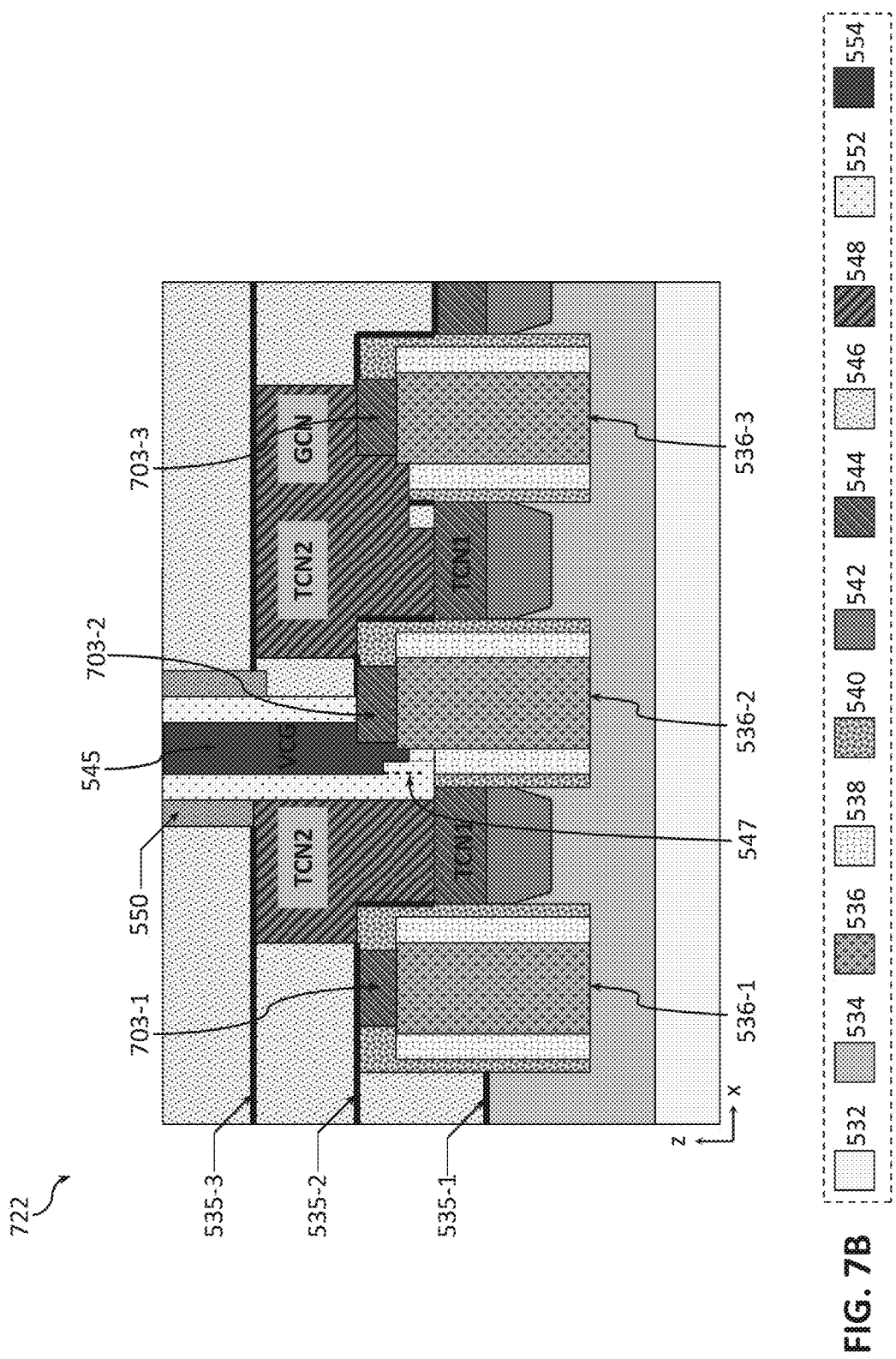
Figure 8:
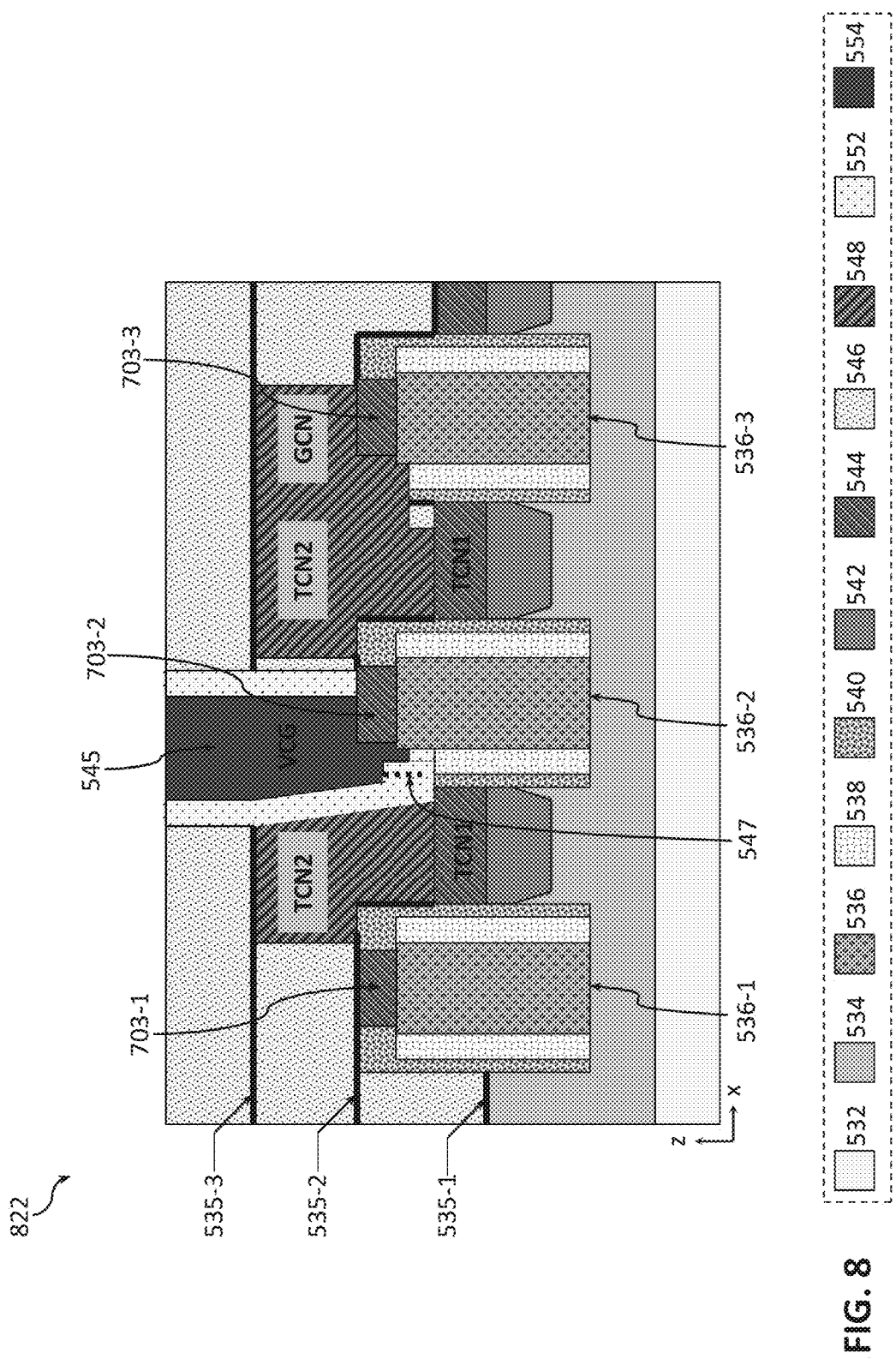
FIG. 8 is a cross-sectional side view illustrating a different example stage in the manufacture of an alternative transistor arrangement with one or more gate straps using the method of FIGS. 4A-4B, according to other embodiments of the present disclosure.
Figure 9:
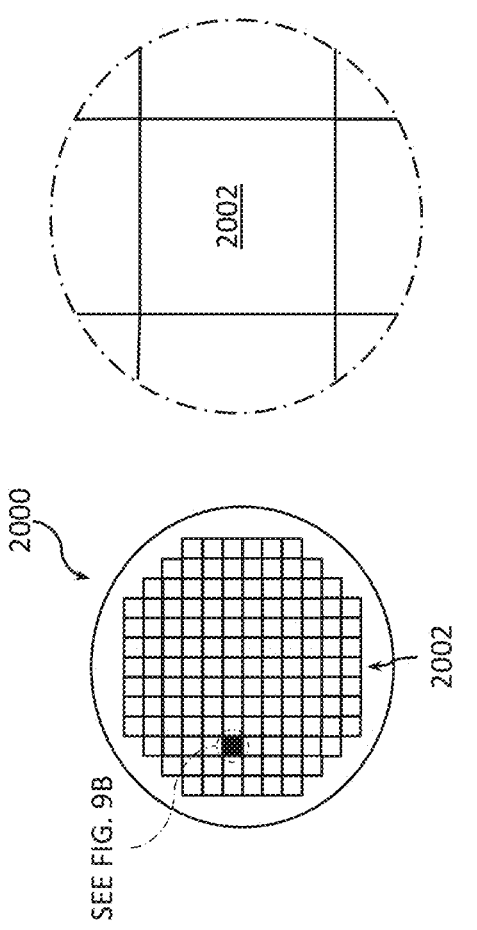
FIGS. 9A and 9B are top views of, respectively, a wafer and dies that may include one or more transistor arrangements with one or more stacked trench contacts and/or one or more gate straps in accordance with any of the embodiments disclosed herein.

Manufacturing transistor arrangements as was described with reference to the method 400 may leave several characteristic features in the final IC structure. Some of these characteristic features were described above. Other characteristic features will now be described with reference to the IC structure 522, shown in FIG. 5K, although these features are also applicable to the IC structure 622, shown in FIG. 6D, as well as to the IC structures with gate straps as shown in FIGS. 7 and 8 and described below.

One characteristic feature is that the gate contact via VCG is provided in an opening lined with at least one dielectric material, namely, the second liner material 552. Another characteristic feature is that such dielectric material (i.e., the second liner material 552) is between and, therefore, electrically isolates, the VCG material 554 and the TCN2 material 548. Furthermore, such dielectric material (i.e., the second liner material 552) at the bottom of the via opening for the gate contact via VCG is between, and, therefore, electrically isolates, the VCG material 554 and the TCN1 material 544 provided over the S/D contact 542 between the gates 536-1 and 536-2.

Another characteristic feature is that the via opening for the gate contact via VCG is self-aligned to the TCN2 material 548 provided over the S/D contact 542 between the gates 536-1 and 536-2. This self-alignment is a result of the opening for the gate contact via VCG being formed after the deposition of, and using an etch process that is selective to, the TCN2 material 548 provided over the S/D contact 542 between the gates 536-1 and 536-2 (e.g., as described herein with reference to the formation of the opening 543 in the process 416 of the method 400).

There are other features related to the alignment of the via opening for the gate contact via VCG that are characteristic of the use of the method 400. For example, one such feature is that the lowest portion at the bottom of the via opening for the gate contact via VCG may be aligned with the top of the TCN1 material 544 provided over the S/D contact 542 between the gates 536-1 and 536-2 (i.e., aligned with the recess of the TCN1). Another such feature is that, besides being on top of, e.g., in contact with, the gate electrode material of the gate 536-2, the VCG material 554 may also wrap around, e.g., be in contact with, the side of said gate electrode material that is closest to the TCN2 material 548 provided over the S/D contact 542 between the gates 536-1 and 536-2.

The presence of the gate cap 540, as described above, is also characteristic of the use of the method 400. For example, the presence of a portion of the gate cap 540 between, and, therefore, electrically isolating, the TCN2 material 548 in the opening 539-1 and the gate electrode material of the gate 536-1 may be characteristic of the method 400. In another example, the presence of a portion of the gate cap 540 between the gate electrode material of the gate 536-1 and the TCN1 material 544 over the S/D contact 542 between the gates 536-1 and 536-2 may be characteristic of the method 400.

The presence of the etch-stop material 535 in certain portions of the IC structures, as described above, may also be characteristic of the use of the method 400. For example, the etch-stop material 535-2 may be present over a top of a portion of the gate cap 540 that is not between the TCN2 material 548 in the opening 539-1 and the gate electrode material of the gate 536-1.

Still other characteristic features include the presence of the seam 547 in the dielectric material 552 and having the TCN1 material 544 provided above the S/D contacts 542 being recessed with respect to the upper surfaces of the gate electrode material of the gates 536, if the misalignment is sufficiently large, as described above. The seam 547 may not be present is the misalignment of the opening 543 is not large enough (e.g., if the TCN2 misalignment to TCN1 or VCG misalignment to gate is not large enough).

The method 400 as described above may provide improvements in terms of increasing the edge placement error margin when forming trench and gate contacts of transistor arrangements. In further embodiments, some processes the method 400 may be extended to also reduce the gate resistance of the gates 536. In such embodiments, the TCN1 material 544 may be deposited over the gate electrodes of transistors to advantageously reduce gate resistance. An example of that is shown with a cross-sectional side view of an IC structure 702, illustrated in FIG. 7A. The IC structure 702 is similar to the IC structure 502, described above, and provides another example result of the process 402. The difference is that the IC structure 702 further includes portions 703 of the TCN1 material 544 provided over the upper surface, e.g., in contact with, the gate electrode material of the gates 536, where the portions 703 are gate straps that aim to reduce the gate resistance of the gates 536. The gate straps 703 provided over different ones of the gates 536-1, 536-2, and 536-3 are labeled in FIG. 7A as, respectively, gate straps 703-1, 703-2, and 703-3. The TCN1 material 544 of the gate straps 703 would typically have a lower resistance than that of the gate electrode materials of the gates 536, thereby advantageously reducing the equivalent gate resistance for the transistors of the transistor arrangement of the IC structure 702.

The method 400 may then proceed with processes 404-422 as described above but performed starting with the IC structure 702 instead of the IC structure 502. An IC structure 722, shown in FIG. 7B, is an example result of the process 422, described above, but starting from the result of the process 402 being the IC structure 702. Except for the differences described with respect to the IC structure 702 (namely, the presence of the gate straps 703), descriptions of the IC structure 522 are applicable to the IC structure 722 and, therefore, in the interests of brevity, are not repeated. Another alternative implementation is shown in FIG. 8, illustrating an IC structure 822, which is an example result of the process 422, described above, but starting from the result of the process 402 being the IC structure 702 and proceeding with the method 400 that does not include the optional process 414 (i.e., the IC structure 822 is a combination of the embodiments described with reference to FIG. 7 where the gate straps 703 are implemented and the embodiments described with reference to FIG. 6 where the process 414 was omitted). Except for the differences described with respect to the IC structure 702, descriptions of the IC structure 622 are applicable to the IC structure 822 and, therefore, in the interests of brevity, are not repeated.

The IC structures 722 and 822 illustrate that, some of the gate straps 703 may be in contact with other electrically conductive materials. For example, the TCN1 material 544 of the gate strap 703-2 may be in contact with the VCG material 545, while the TCN1 material 544 of the gate strap 703-3 may be in contact with the TCN2 material 548 of the GCN. On the other hand, the TCN1 material 544 of the gate strap 703-1 may be electrically isolated from the TCN2 material 548 by virtue of the etch-stop material 535-2.

While FIGS. 7 and 8 illustrate the gate straps 703 implemented in transistor arrangements fabricated using the method 400, in other embodiments, gate and trench contacts may be provided for the IC structure 702 using any other method. In other words, in other embodiments, transistor arrangements with the gate straps 703 may be implemented without implementing the stacked trench contacts in the manner described herein (e.g., the gate straps 703 may be combined with any conventional ways to provide trench contacts).

Variations and Implementations

The IC structures illustrated in and described with reference to FIGS. 1-8 do not represent an exhaustive set of assemblies in which one or more transistor arrangements with one or more stacked trench contacts and/or one or more gate straps as described herein may be integrated, but merely provide examples of such arrangements. For example, while descriptions and drawings provided herein refer to FinFETs, these descriptions and drawings are equally applicable to embodiments any other non-planar FETs besides FinFETs that are formed on the basis of an elongated structure of a suitable channel material, e.g., to nanoribbon transistors, nanowire transistors, or transistors such as nanoribbon/nanowire transistors but having transverse cross-sections of any geometry (e.g., oval, or a polygon with rounded corners). In another example, although particular arrangements of materials are discussed with reference to FIGS. 1-8, intermediate materials may be included in various portions of these drawings. Additionally, while FIGS. 1-8 may illustrate various elements, e.g., various openings shown in FIG. 5, the gate electrode material of the gates 536, etc., as having perfectly straight sidewall profiles, i.e., profiles where the sidewalls extend perpendicularly to the support structure 532, these idealistic profiles may not always be achievable in real-world manufacturing processes. Namely, while designed to have straight sidewall profiles, real-world openings which may be formed as a part of fabricating various elements of the transistor arrangements illustrated in FIGS. 1-8 may end up having either so-called "non-re-entrant" profiles, where the width at the top of the opening is larger than the width at the bottom of the opening, or "re-entrant" profiles, where the width at the top of the opening is smaller than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of transistor arrangements with one or more stacked trench contacts and/or one or more gate straps as provided herein are equally applicable to embodiments where various elements of IC structures including such transistor arrangements look different from those shown in the drawings due to manufacturing processes used to form them.

Example Electronic Devices

The IC structures with transistor arrangements with one or more stacked trench contacts and/or one or more gate straps, disclosed herein, may be included in any suitable electronic device. For example, in various embodiments, the transistor arrangement 320 may be a part of at least one of a memory device, a computing device, a wearable device, a handheld electronic device, and a wireless communications device. FIGS. 9-12 illustrate various examples of apparatuses that may include one or more of the transistor arrangements with one or more stacked trench contacts and/or one or more gate straps disclosed herein.

FIGS. 9A-9B are top views of a wafer 2000 and dies 2002 that may include one or more IC structures with one or more transistor arrangements with one or more stacked trench contacts and/or one or more gate straps in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 10. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more transistor arrangements with one or more stacked trench contacts and/or one or more gate straps as described herein). After the fabrication of the semiconductor product is complete (e.g., after manufacture of one or more layers of an IC structure with at least one transistor arrangement with one or more stacked trench contacts and/or one or more gate straps as described herein), the wafer 2000 may undergo a singulation process in which each of the dies 2002 is separated from one another to provide discrete "chips" of the semiconductor product. In particular, devices that include one or more transistor arrangements with one or more stacked trench contacts and/or one or more gate straps as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a static RAM (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 12) or other logic that is configured to store information in the memory devices or execute instructions stored in the memory array.

Figure 10:
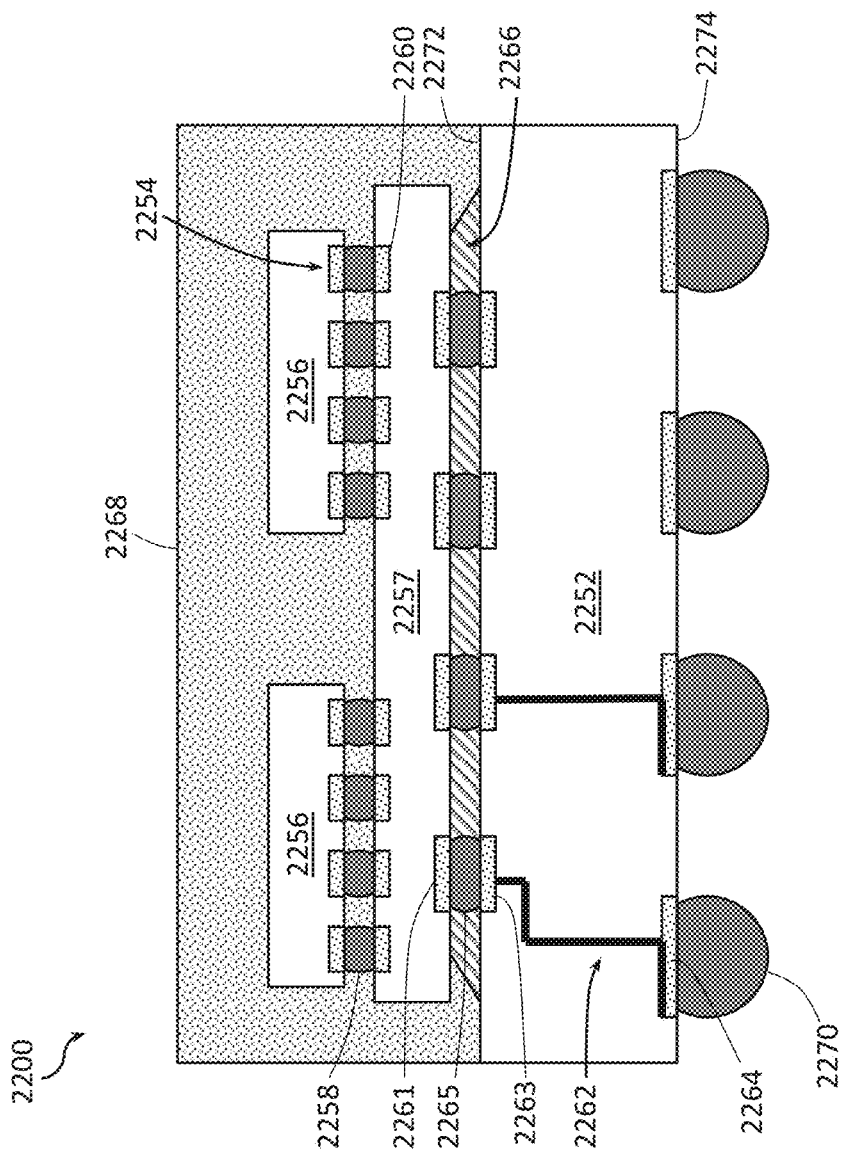
FIG. 10 is a cross-sectional side view of an IC package that may include one or more transistor arrangements with one or more stacked trench contacts and/or one or more gate straps in accordance with any of the embodiments disclosed herein.

FIG. 10 is a side, cross-sectional view of an example IC package 2200 that may include one or more transistor arrangements with one or more stacked trench contacts and/or one or more gate straps in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 10 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 10 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 10 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 11.

The dies 2256 may take the form of any of the embodiments of the die 2002 discussed herein (e.g., may include any of the embodiments of the IC structures with transistor arrangements with one or more stacked trench contacts and/or one or more gate straps as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more IC structures with one or more transistor arrangements with one or more stacked trench contacts and/or one or more gate straps as discussed above; in some embodiments, at least some of the dies 2256 may not include any transistor arrangements with one or more stacked trench contacts and/or one or more gate straps.

The IC package 2200 illustrated in FIG. 10 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 10, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 11:
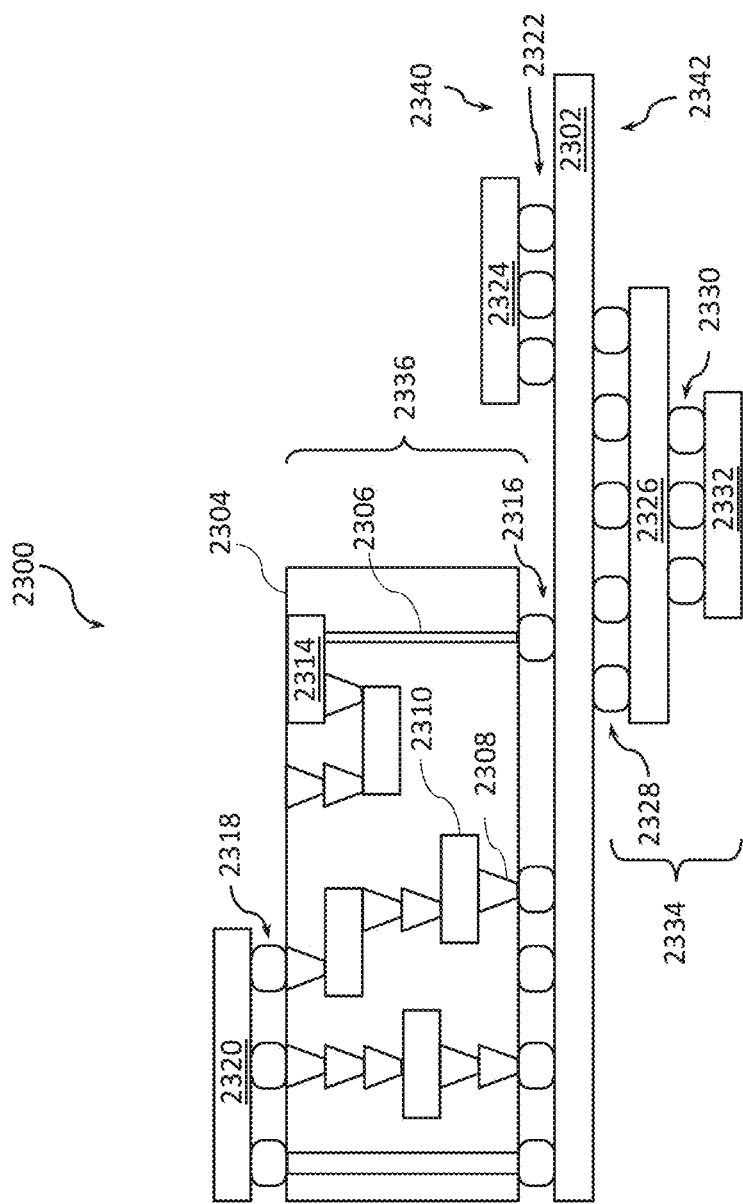
FIG. 11 is a cross-sectional side view of an IC device assembly that may include one or more transistor arrangements with one or more stacked trench contacts and/or one or more gate straps in accordance with any of the embodiments disclosed herein.

FIG. 11 is a cross-sectional side view of an IC device assembly 2300 that may include components having one or more transistor arrangements with one or more stacked trench contacts and/or one or more gate straps in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC structures with one or more transistor arrangements with one or more stacked trench contacts and/or one or more gate straps in accordance with any of the embodiments disclosed herein; e.g., any of the IC packages discussed below with reference to the IC device assembly 2300 may take the form of any of the embodiments of the IC package 2200 discussed above with reference to FIG. 10

(e.g., may include one or more transistor arrangements with one or more stacked trench contacts and/or one or more gate straps provided on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 11 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 11), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 9B), an IC device, or any other suitable component. In particular, the IC package 2320 may include one or more transistor arrangements with one or more stacked trench contacts and/or one or more gate straps as described herein. Although a single IC package 2320 is shown in FIG. 11, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 11, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include any number of metal lines 2310, vias 2308, and through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 11 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 12:
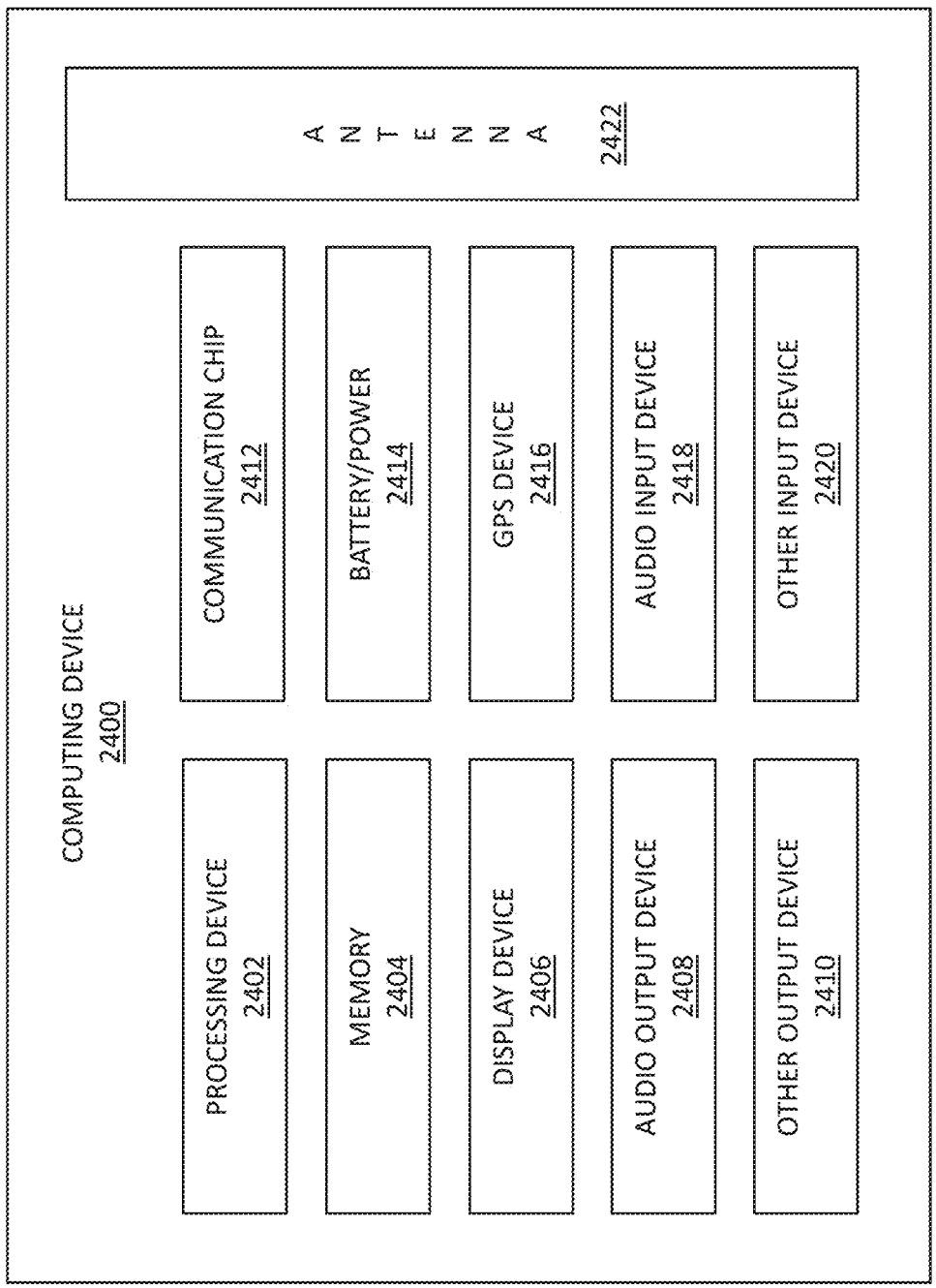
FIG. 12 is a block diagram of an example computing device that may include one or more transistor arrangements with one or more stacked trench contacts and/or one or more gate straps in accordance with any of the embodiments disclosed herein.

FIG. 12 is a block diagram of an example computing device 2400 that may include one or more components with one or more transistor arrangements with one or more stacked trench contacts and/or one or more gate straps in accordance with any of the embodiments disclosed herein. For example, any suitable ones of the components of the computing device 2400 may include a die (e.g., the die 2002, shown in FIG. 9B) implementing transistor arrangements with one or more stacked trench contacts and/or one or more gate straps in accordance with any of the embodiments disclosed herein. Any of the components of the computing device 2400 may include an IC package 2200 (e.g., as shown in FIG. 10). Any of the components of the computing device 2400 may include an IC device assembly 2300 (e.g., as shown in FIG. 11).

A number of components are illustrated in FIG. 12 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system on a chip (SoC) die.

Additionally, in various embodiments, the computing device 2400 may not include one or more of the components illustrated in FIG. 12, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides a transistor arrangement that includes a channel material; a gate electrode material (e.g., the gate electrode material 536, shown in the present drawings) provided over a gate portion of the channel material; a source or drain (S/D) contact material (e.g., the S/D contact material 542, shown in the present drawings) provided in a portion of the channel material adjacent to the gate portion of the channel material; a first electrically conductive material (TCN1 material) (e.g., the first trench contact material 544, shown in the present drawings) provided over the S/D contact material; a second electrically conductive material (TCN2 material) (e.g., the second trench contact material 548, shown in the present drawings) provided over the TCN1 material; and a gate contact via (VCG) provided over a portion of the gate electrode material as a via opening provided over a portion of the gate electrode material, the via opening having a dielectric material (e.g., the dielectric material 552, shown in the present drawings) at sidewalls of the via opening and at least a portion of a bottom of the via opening, and further having a third electrically conductive material (VCG material) (e.g., the VCG material 554, shown in the present drawings) filling at least a portion of the via opening with the dielectric material. In such a transistor arrangement, the dielectric material at a sidewall of the via opening closest to the TCN2 material is between, and, therefore, electrically isolates, the VCG material and the TCN2 material. Furthermore, the dielectric material at the bottom of the via opening is between, and therefore, electrically isolates, the VCG material and the TCN1 material provided over the S/C-S/D contact material.

Example 2 provides the transistor arrangement according to example 1, where the via opening is self-aligned to the TCN2 material.

Example 3 provides the transistor arrangement according to examples 1 or 2, where the dielectric material has a seam (e.g., the seam 547, described herein) in a portion of the via opening between a sidewall of the via opening that is closest to the TCN2 material and a sidewall of the gate electrode material, i.e., proximate to the bottom of the via opening.

Example 4 provides the transistor arrangement according to any one of the preceding examples, where the TCN1 material is recessed with respect to the gate electrode material.

Example 5 provides the transistor arrangement according to example 4, where a distance between a top of the TCN1 material and a top of the gate electrode material (i.e., the recess of the TCN1 material with respect to the gate electrode material) is at least about 5 nanometers, e.g., at least about 10 nanometers, e.g., between about 5 and 20 nanometers.

Example 6 provides the transistor arrangement according to examples 4 or 5, where a lowest portion at the bottom of the via opening is aligned with a top of the TCN1 material.

Example 7 provides the transistor arrangement according to any one of the preceding examples, where the VCG material is in contact with a portion of a top of the gate electrode material and a portion of a sidewall of the gate electrode material.

Example 8 provides the transistor arrangement according to any one of the preceding examples, where the gate portion of the channel material is a first gate portion and where the transistor arrangement further includes the gate electrode material provided over a second gate portion of the channel material, different from the first gate portion (e.g., the gate electrode material provided over the first gate portion of the channel material is the gate electrode material of the gate 536-2, while the gate electrode material provided over the second gate portion of the channel material is the gate electrode material of the gate 536-1). Furthermore, the dielectric material is a first dielectric material, the transistor arrangement further includes a second dielectric material (e.g., the dielectric material of the additional gate spacer 540, shown in the present drawings) provided over a top of the gate electrode material provided over the second gate portion (e.g., provided over the gate 563-1 of the present drawings), and a portion of the second dielectric material is between, and, therefore, electrically isolates, the TCN2 material and the gate electrode material provided over the second gate portion.

Example 9 provides the transistor arrangement according to example 8, further including an etch-stop material (e.g., the etch-stop material 535-2, shown in the present drawings) provided over a portion of the second dielectric material that is not between the TCN2 material and the gate electrode material provided over the second gate portion.

Example 10 provides the transistor arrangement according to examples 8 or 9, further including the second dielectric material between the gate electrode material provided over the second gate portion and the TCN1 material.

Example 11 provides the transistor arrangement according to any one of examples 8-10, further including the TCN1 material in contact with a top portion of the gate electrode material provided over the second gate portion.

Example 12 provides the transistor arrangement according to any one of examples 8-11, further including the TCN1 material in contact with a top portion of the gate electrode material provided over the first gate portion.

Example 13 provides the transistor arrangement according to example 12, where the TCN1 material in contact with the top portion of the gate electrode material provided over the first gate portion is further in contact with the VCG material.

Example 14 provides the transistor arrangement according to any one of the preceding examples, where the channel material is shaped as a fin or as a nanoribbon.

Example 15 provides the transistor arrangement according to any one of the preceding examples, where the transistor arrangement is a part of at least one of a memory device, a computing device, a wearable device, a handheld electronic device, and a wireless communications device.

Example 16 provides an IC package that includes an IC die, including a transistor arrangement; and a further IC component, coupled to the IC die. The transistor arrangement includes a channel material, a gate electrode material (e.g., the gate electrode material 536, shown in the present drawings) provided over a gate portion of the channel material, a source or drain (S/D) contact material (e.g., the S/D contact material 542, shown in the present drawings) provided in a portion of the channel material adjacent to the gate portion of the channel material, a first electrically conductive material (TCN1 material) (e.g., the first trench contact material 544, shown in the present drawings) provided over the S/D contact material, a second electrically conductive material (TCN2 material) (e.g., the second trench contact material 548, shown in the present drawings) provided over the TCN1 material, and a gate contact via (VCG) provided over a portion of the gate electrode material as a via opening provided over a portion of the gate electrode material, the via opening having a dielectric material (e.g., the dielectric material 552, shown in the present drawings)

at sidewalls of the via opening and at least a portion of a bottom of the via opening, and further having a third electrically conductive material (VCG material) (e.g., the VCG material 554, shown in the present drawings) filling at least a portion of the via opening with the dielectric material, where a lowest portion in the bottom of the via opening is aligned with a top of the TCN1 material.

Example 17 provides the IC package according to example 16, where the further IC component includes one of a package substrate, an interposer, or a further IC die.

Example 18 provides the IC package according to examples 16 or 17, where the IC die includes, or is a part of, at least one of a memory device, a computing device, a wearable device, a handheld electronic device, and a wireless communications device.

Example 19 provides a method of fabricating a transistor arrangement, the method including providing a channel material; providing a gate electrode material (e.g., the gate electrode material 536, shown in the present drawings) provided over a gate portion of the channel material; providing a source or drain (S/D) contact material (e.g., the S/D contact material 542, shown in the present drawings) provided in a portion of the channel material adjacent to the gate portion of the channel material; providing a first electrically conductive material (TCN1 material) (e.g., the first trench contact material 544, shown in the present drawings) provided over the S/D contact material; providing a second electrically conductive material (TCN2 material) (e.g., the second trench contact material 548, shown in the present drawings) provided over the TCN1 material; and providing a gate contact via (VCG) provided over a portion of the gate electrode material as a via opening provided over a portion of the gate electrode material, the via opening having a dielectric material (e.g., the dielectric material 552, shown in the present drawings) at sidewalls of the via opening and at least a portion of a bottom of the via opening, and further having a third electrically conductive material (VCG material) (e.g., the VCG material 554, shown in the present drawings) filling at least a portion of the via opening with the dielectric material. In such method, the dielectric material at a sidewall of the via opening closest to the TCN2 material is between, and, therefore, electrically isolates, the VCG material and the TCN2 material, and the dielectric material at the bottom of the via opening is between, and, therefore, electrically isolates, the VCG material and the TCN1 material.

Example 20 provides the method according to example 19, further including self-aligning the via opening to the TCN2 material.

In further examples, the method according to any one of examples 19-20 may further include processes for forming the transistor arrangement and/or the IC package according to any one of the preceding examples.

Example 21 provides a transistor arrangement that includes a channel material; a gate electrode material (e.g., the gate electrode material 536, shown in the present drawings) provided over a gate portion of the channel material; a source or drain (S/D) contact material (e.g., the S/D contact material 542, shown in the present drawings) provided in a portion of the channel material adjacent to the gate portion of the channel material; a first electrically conductive material (TCN1 material) (e.g., the first trench contact material 544, shown in the present drawings) provided over (e.g., in contact with) the S/D contact material; and the TCN1 material in contact with a top portion of the gate electrode material, where the TCN1 material in contact with the top portion of the gate electrode material is electrically isolated from the TCN1 material provided over the S/D contact material.

Example 22 provides the transistor arrangement according to example 21, further including a first gate spacer material provided over sidewalls of the gate electrode material; and a second gate spacer material provided over sidewalls of the TCN1 material in contact with the top portion of the gate electrode material.

Example 23 provides the transistor arrangement according to example 22, where the second gate spacer material is further provided over the sidewalls of the gate electrode material so that the first gate spacer material is between the gate electrode material and the second gate spacer material.

Example 24 provides the transistor arrangement according to example 23, where the second gate spacer material is between the first gate spacer material and the TCN1 material provided over the S/D contact material.

Example 25 provides the transistor arrangement according to examples 23 or 24, where the first gate spacer material is between the gate electrode material and the TCN1 material provided over the S/D contact material.

Example 26 provides the transistor arrangement according to any one of examples 21-25, where the channel material is shaped as a fin or as a nanoribbon.

Example 27 provides the transistor arrangement according to any one of examples 21-26, where the transistor arrangement is a part of at least one of a memory device, a computing device, a wearable device, a handheld electronic device, and a wireless communications device.

Example 28 provides an IC package that includes an IC die, including a transistor arrangement according to any one of examples 21-27; and a further IC component, coupled to the IC die.

Example 29 provides the IC package according to example 28, where the further IC component includes one of a package substrate, an interposer, or a further IC die.

Example 30 provides the IC package according to examples 28 or 29, where the IC die includes, or is a part of, at least one of a memory device, a computing device, a wearable device, a handheld electronic device, and a wireless communications device.

Example 31 provides a method of fabricating a transistor arrangement, the method including providing a channel material; providing a gate electrode material (e.g., the gate electrode material 536, shown in the present drawings) provided over a gate portion of the channel material; providing a source or drain (S/D) contact material (e.g., the S/D contact material 542, shown in the present drawings) provided in a portion of the channel material adjacent to the gate portion of the channel material; providing a first electrically conductive material (TCN1 material) (e.g., the first trench contact material 544, shown in the present drawings) provided over (e.g., in contact with) the S/D contact material; and providing the TCN1 material in contact with a top portion of the gate electrode material, where the TCN1 material in contact with the top portion of the gate electrode material is electrically isolated from the TCN1 material provided over the S/D contact material.

Example 32 provides the method according to example 31, further including processes for forming the transistor arrangement according to any one of examples 21-27 and/or the IC package according to any one of examples 28-30.

Example 33 provides an electronic device that includes a carrier substrate; and an IC die coupled to the carrier substrate, where the IC die includes the transistor arrangement according to any one of examples 1-15 or any one of examples 21-27, or is included in the IC package according to any one of examples 16-18 or any one of examples 28-30.

Example 34 provides the electronic device according to example 33, where the electronic device is a wearable electronic device (e.g., a smart watch) or handheld electronic device (e.g., a mobile phone).

Example 35 provides the electronic device according to examples 33 or 34, where the electronic device further includes one or more communication chips and an antenna.

Example 36 provides the electronic device according to any one of examples 33-35, where the carrier substrate is a motherboard.

Example 37 provides the electronic device according to any one of examples 33-36, where the electronic device is an RF transceiver.

Example 38 provides the electronic device according to any one of examples 33-37, where the electronic device is one of a switch, a power amplifier, a low-noise amplifier, a filter, a filter bank, a duplexer, an upconverter, or a downconverter of an RF communications device, e.g. of an RF transceiver.

Example 39 provides the electronic device according to any one of examples 33-38, where the electronic device is included in a base station of a wireless communication system.

Example 40 provides the electronic device according to any one of examples 33-38, where the electronic device is included in a user equipment device (i.e., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) package, comprising:
   an IC die, comprising a transistor arrangement; and
   a further IC component, coupled to the IC die,
   wherein the transistor arrangement includes:
      a channel material,
      a gate electrode over a gate portion of the channel material,
      a contact in a portion of the channel material adjacent to the gate portion, wherein the contact is a contact to a source region or a drain region of the transistor arrangement,
      a first region comprising a first conductive material over the contact,
      a second region comprising a second conductive material over the first region, and
      a via over a portion of the gate electrode, the via having a dielectric material at sidewalls of the via and at least a portion of a bottom of the via, and further having a third conductive material in at least a portion of the via with the dielectric material,
      wherein a lowest portion in the bottom of the via is aligned with an uppermost portion of the first region, and the via is above the portion of the gate electrode and at least partially overlaps with the gate electrode.

2. The IC package according to claim 1, wherein the further IC component includes one of a package substrate, an interposer, or a further IC die.

3. The IC package according to claim 1, further comprising a mold compound around the IC die.

4. The IC package according to claim 1, further comprising interconnects between conductive contacts of the IC die and conductive contacts of the further IC component.

5. The IC package according to claim 1, wherein the IC die includes, or is a part of, at least one of a memory device, a computing device, a wearable device, a handheld electronic device, and a wireless communications device.

6. The IC package according to claim 1, wherein the third conductive material of the via is in conductive contact with the gate electrode.

7. The IC package according to claim 1, wherein, in a cross section of the transistor arrangement in a plane perpendicular to a plane of the channel material, all of the first conductive material of the first region is closer to the contact than the second region.

8. An integrated circuit (IC) structure, comprising:
   a transistor comprising a channel material;
   a gate electrode over a portion of the channel material;
   a first contact coupled to one of a source region or a drain region of the transistor, the first contact comprising one or more first conductive materials over the one of the source region or the drain region of the transistor;
   a second contact coupled to another one of the source region or the drain region of the transistor, the second contact comprising one or more third conductive materials over the another one of the source region or the drain region of the transistor; and
   a gate contact coupled to the gate electrode, the gate contact comprising an opening over a portion of the gate electrode and extending from an uppermost portion of the gate electrode along a sidewall of the gate electrode, the opening having an insulator material in a portion of the opening that extends from the uppermost portion of the gate electrode along the sidewall of the gate electrode, and further having a second conductive material in at least a portion of the opening with the insulator material,
   wherein the insulator material in the portion of the opening that extends from the uppermost portion of the gate electrode along the sidewall of the gate electrode is between and separates the second conductive material and the one or more first conductive materials, and the one or more first conductive materials are electrically isolated from the second conductive material in the opening, and
   wherein the insulator material in the opening is between and separates the second conductive material and the one or more third conductive materials, and the one or more third conductive materials are electrically isolated from the second conductive material in the opening.

9. The IC structure according to claim 8, wherein the second conductive material in the opening and the gate electrode are in conductive contact.

10. An integrated circuit (IC) structure, comprising:
   a channel material;
   a first transistor comprising a first gate electrode over a first portion of the channel material;
   a second transistor comprising a second gate electrode over a second portion of the channel material;
   a first contact coupled to one of a source region or a drain region of the first transistor, the first contact comprising one or more first conductive materials over the one of the source region or the drain region of the first transistor;

a second contact coupled to another one of the source region or the drain region of the first transistor, the second contact comprising one or more second conductive materials over the another one of the source region or the drain region of the first transistor, wherein the one or more second conductive materials of the second contact are electrically connected to the second gate electrode; and a gate contact coupled to the first gate electrode, the gate contact comprising an opening over a portion of the first gate electrode and extending from an uppermost portion of the first gate electrode along a sidewall of the first gate electrode, the opening having an insulator material in a portion of the opening that extends from the uppermost portion of the first gate electrode along the sidewall of the first gate electrode, and further having a third conductive material in at least a portion of the opening with the insulator material, wherein the third conductive material of the gate contact is electrically insulated from the one or more first conductive materials of the first contact and the one or more second conductive materials of the second contact.

11. The IC structure according to claim 10, wherein a portion of the third conductive material is in the portion of the opening that extends from the uppermost portion of the first gate electrode along the sidewall of the first gate electrode.

12. The IC structure according to claim 11, wherein the portion of the third conductive material in the portion of the opening that extends from the uppermost portion of the first gate electrode along the sidewall of the first gate electrode is in contact with the sidewall of the first gate electrode.

13. The IC structure according to claim 10, wherein the third conductive material is in conductive contact with the first gate electrode.

14. The IC structure according to claim 10, wherein the third conductive material and the first gate electrode are directly electrically connected.

15. The IC structure according to claim 10, wherein:
the second transistor includes a first one of a source region or a drain region of the second transistor and a second one of the source region or the drain region of the second transistor, the first one of the source region or the drain region of the second transistor is further from the first gate electrode than the second one of the source region or the drain region of the second transistor, and the second one of the source region or the drain region of the second transistor and the another one of the source region or the drain region of the first transistor are a single shared region.

16. The IC structure according to claim 10, wherein:
the second transistor includes a first one of a source region or a drain region of the second transistor and a second one of the source region or the drain region of the second transistor, the first one of the source region or the drain region of the second transistor is further from the first gate electrode than the second one of the source region or the drain region of the second transistor, and the second one of the source region or the drain region of the second transistor is the another one of the source region or the drain region of the first transistor.

17. The IC structure according to claim 10, wherein:
the sidewall of the first gate electrode is a first sidewall of the first gate electrode, the first gate electrode further has a second sidewall, the first sidewall is closer to the first contact than the second sidewall, and the second sidewall is closer to the second contact than the first sidewall.

18. The IC structure according to claim 17, wherein:
the first sidewall is closer to the first contact than to the second contact, and the second sidewall is closer to the second contact than to the first contact.

19. The IC structure according to claim 10, wherein:
the first contact includes a first conductive portion above the one of the source region or the drain region of the first transistor, a second conductive portion above the first conductive portion, and a third conductive portion above the second conductive portion, and a bottom portion of the portion of the opening that extends from the uppermost portion of the first gate electrode along the sidewall of the first gate electrode is aligned with an uppermost portion of the second conductive portion.

20. The IC structure according to claim 19, wherein the opening is above the portion of the first gate electrode and at least partially overlaps with the first gate electrode.

\* \* \* \* \*